(12) United States Patent
Worley et al.

(10) Patent No.: US 7,370,264 B2
(45) Date of Patent: May 6, 2008

(54) H-MATRIX FOR ERROR CORRECTING CIRCUITRY

(75) Inventors: James Leon Worley, Denton, TX (US); Laurent Murillo, Marseilles (FR)

(73) Assignees: STMicroelectronics, Inc., Carrollton, TX (US); STMicroelectronics S.A. (FR)

( * ) Notice: Subject to any disclaimer, the term of this patent is extended or adjusted under 35 U.S.C. 154(b) by 337 days.

(21) Appl. No.: 10/742,627

(22) Filed: Dec. 19, 2003

(65) Prior Publication Data

US 2005/0149833 A1    Jul. 7, 2005

(51) Int. Cl.
*H03M 10/00*    (2006.01)

(52) U.S. Cl. ..................... 714/781; 714/777

(58) Field of Classification Search .......... 714/777, 714/781; 708/520
See application file for complete search history.

(56) References Cited

U.S. PATENT DOCUMENTS 4,569,052 A * 2/1986 Cohn et al. .................. 714/763
7,058,876 B1 * 6/2006 Ireland et al. ............... 714/781
2003/0187899 A1 * 10/2003 Ohta ........................... 708/520

* cited by examiner

*Primary Examiner*—Guy J. Lamarre
(74) *Attorney, Agent, or Firm*—Lisa K. Jorgenson; Bryan A. Santarelli

(57) ABSTRACT

A matrix H for encoding data words is defined for wide word ECC with uniform density and a reduced number of components. The H-matrix is incorporated in an encode unit operable to Hamming encode a data word with a 10×528 matrix generated in groups of four columns wherein; a first column is a complement of a second column; the value of the second column ranges from 9 to 271 in increments of two; a third column is a complement of a fourth column; and the value of the fourth column is the same as the value of the second column less one; and wherein a 528-bit bottom row is added to the 10×528 matrix comprising alternating zeroes and ones starting with a zero creating an 11×528 matrix.

25 Claims, 33 Drawing Sheets

Fig. 4A (Prior Art)

$$H = \begin{pmatrix} 1 & 1 & 1 & 1 & 1 & 0 & 0 & 0 & 0 & 0 & 0 & 0 & 0 & 0 & 0 \\ 0 & 0 & 0 & 0 & 0 & 1 & 1 & 1 & 1 & 1 & 0 & 0 & 0 & 0 & 0 \\ 1 & 1 & 0 & 0 & 0 & 1 & 1 & 1 & 0 & 0 & 1 & 1 & 1 & 0 & 0 \\ 0 & 1 & 1 & 1 & 0 & 1 & 0 & 0 & 1 & 0 & 1 & 1 & 0 & 1 & 1 \\ 1 & 0 & 1 & 0 & 1 & 0 & 1 & 0 & 1 & 1 & 1 & 0 & 1 & 1 & 1 \end{pmatrix}$$

$$(X_0 \; X_1 \; \text{-----} \; X_{15}) * H = (C_0 \; C_1 \; C_2 \; C_3 \; C_4)$$

$$S = \begin{pmatrix} S_0 \\ S_1 \\ S_2 \\ S_3 \\ S_4 \end{pmatrix} = H' * \begin{pmatrix} X_r \\ C_r \end{pmatrix}$$

$$M = \begin{bmatrix} \text{matrix with columns } A_0, A_1, A_2, A_3, A_4, A_5, A_6, A_7 \end{bmatrix}$$

(K and L denote bracketed column groupings at the right of matrix M.)

$$M' = \begin{bmatrix} \text{...matrix of bits...} \end{bmatrix}$$

Fig. 7B (Prior Art)

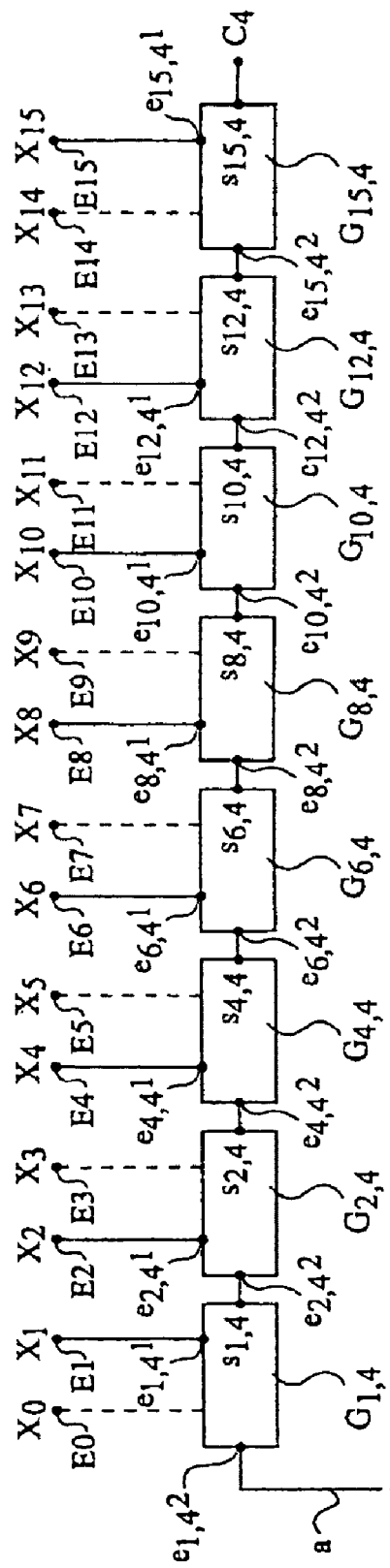

```
 1    AAAAAAAAAAAAAAAAAAAA
 2    AAAAAAAAAAAAAAAAAAAA
 3    AAAAAAAAAAAAAAAAAAAA
 4    AAAAAAAAAAAAAAAAAAAA
 5    AAAAAAAAAAAAAAA55555
 6    AAAAAAAAAA5555555555
 7    AAAA5555AAAA5555AAAA55
 8    AA55AA55AA55AA55AA
 9    A5A5A5A5A5A5A5A5A5A5
10    66666666666666666666
11    55555555555555555555
```

|    | $H_s$ — 88 |
|----|---|
| 1  | 1010101010101010101010101010101010101010101010101010101010101010 |
| 2  | 1010101010101010101010101010101010101010101010101010101010101010 |
| 3  | 1010101010101010101010101010101010101010101010101010101010101010 |
| 4  | 1010101010101010101010101010101010101010101010101010101010101010 |
| 5  | 1010101010101010101010101010101010101010101010101010101010101010 |
| 6  | 1010101010101010101010101010101010101010101010101010101010101010 |
| 7  | 0101010101010010111010101010101010101010101010101010101010101010 |
| 8  | 1010101010101010101010101010101010101010101010100101010101101010 |
| 9  | 1010101011010001110101010101010101010101010101010101010100100101 |
| 10 | 0110011001100110011010101010101010101010101010101001100110011110 |
| 11 | 0100101010101010010101010101010101010101010101010101010101010101 | decimal value = 9

1. 101010101010101010101010101010101010101010101010
2. 101010101010101010101010101010101010101010101010101
3. 010101010101010101010101010101010101010101010101010
4. 010101010101010101010101010101010101010101010101
5. 010101010101010101010101010101010101010101010101010
6. 101010101010101010101010101010101010101010101010
7. 101010101010101010101010101010101010101010101010101
8. 010101010101010101010101010101010101010101010101
9. 101001011010011010010110100110100101101001101001101001101001101001101
10. 011001100110011001100110011001100110011001100110
11. 010101010101010101010101010101010101010101010101010 decimal value = 271

|    | |
|----|---|
| 1  | 10101010101010101010101010101010101010101010101010101010101010101010101010101010101010 |
| 2  | 00000000000000000000000000000000000000000000000000000000000000000000000000000000000000 |
| 3  | 10101010101010101010101010101010101010101010101010101010101010101010101010101010101010 |
| 4  | 10101010101010101010101010101010101010101010101010101010101010101010101010101010101010 |
| 5  | 10101010101010101010101010101010101010101010101010101010101010101010101010101010101010 |
| 6  | 10101010101010101010101010101010101010101010101010101010101010101010101010101010101010 |
| 7  | 01010101010101010101010101010101010101010101010101010101010101010101010101010101010101 |
| 8  | 10101010101010101010101010101010101010101010101010101010101010101010101010101010101010 |
| 9  | 10100101010101010101010101010101010101010101010101010101010101010101010101010101010101 |
| 10 | 01100101100110011001100110011001100110011001100110011001100110011001100110011001100110 |
| 11 | 01010101010101010101010101010101010101010101010101010101010101010101010101010101010101 |

H-MATRIX FOR ERROR CORRECTING CIRCUITRY

TECHNICAL FIELD

The present invention relates generally to error detection and correction codes, and more specifically to linear error detection and correction codes of the Hamming type.

BACKGROUND

Error detection and correction codes are codes utilized in a wide variety of digital electronic systems to detect and correct errors in stored and communicated data. Using such codes, the value of one or several erroneous bits can be restored to a correct value or values after a storage or a transmission FIG. 1 is a block diagram of a typical memory system 10 including memory 8 for storing data, where the term data includes any type of stored information including program instructions and data generated by or associated with such instructions. When the memory system 10 stores a data word 2, the data word is first presented to error correcting code (ECC) logic 4 before being written into the memory 8. The ECC logic 4 generates error checking and correction bits using the data word 2, and these additional error bits are then stored in memory 8 along with the data word 2. In the following description, the error detection and correction bits may be referred to as check bits, and the original data word 2 in combination with the check bits may collectively be referred to as a code word. The data word 2 and check bits are stored in specific locations in the memory 8 as programmed by redundancy logic 6 which redirects data to redundant storage locations in the memory to thereby replace defective storage locations, as will be described in more detail below. In this way, the redundancy logic 6 replaces defective storage locations to which data was initially directed with redundant storage locations, as will be understood by those skilled in the art. When data is subsequently read from the memory 8, the data is again presented to the ECC logic 4 to ensure the data as read is the same as the data word 2 initially stored in the memory.

The memory 8 is designed to maximize the number of bits available (storage capacity) without sacrificing too much memory speed (the time it takes to store or access the data). Thus, memory cells that store individual bits are packed as closely together as possible through a variety of different techniques, such as by reducing the number of transistors per memory cell and by making the transistors smaller. Typically, the smaller a memory cell the longer it takes to access the cell due to the small voltages and currents that must be properly sensed. Thus, there is a trade off in using more and larger transistors to increase the speed of the memory 8 but at the same time reducing the storage capacity of the memory. As a result, the memory system 10 typically includes a combination of relatively slow but high-capacity memory cells such as dynamic random access memory (DRAM) cells, and also includes lower-capacity but faster memory cells such as static random access memory (SRAM) cells.

An array of memory cells includes a plurality of rows and columns of memory cells, with an address being associated with each memory cell in the array. In high-capacity arrays such as those formed from DRAM cells, the address is typically divided into a column address and a row address. The row address is typically sent first, and in response to the row address the data stored in an entire row of memory cells in the array is sensed and stored in circuitry in the memory 8. The column address is provided to the memory 8 after the row address, and selected ones of the memory cells in the addressed row are selected in response to the column address. If data is being fetched from a series of consecutive column addresses within the same addressed row of memory cells, the data stored in these consecutive columns of memory cells can be accessed from the circuitry that previously sensed and stored the data of the addressed row.

The memory 8 is typically manufactured with spare or redundant bits, and the redundancy logic 6 is programmed to substitute any defective memory cells with redundant memory cells. The redundancy logic 6 is typically programmed during initial testing of the memory 8. Referring to FIG. 2, the memory 8 of FIG. 1 is considered as a memory array 12 of rows and columns of memory cells (not shown). The main approaches to the substitution of defective memory cells in the array 12 with redundant cells utilize laser blown fuses, electrical fuses, or one-time-programmable MOSFETs. Laser fuse based repair is still a common approach, although this type of repair increases test costs substantially since a 3-step test process of test, laser repair, and retest is required. Electrical fuse based repair can be performed as a single process using a tester, which tests, electrically repairs, and retests while the memory 8 is coupled to the tester.

The repair process for substituting redundant memory cells for defective memory cells typically consists of identifying the proper laser programmable fuses, electrically programmable fuses, or one-time-programmable MOSFETs needed to deactivate a defective column 14 of memory cells, deactivating the defective column or group of columns containing a defective cell or cells), activating a redundant column 16 or group of redundant columns of memory cells, and programming the redundancy logic 6 to assign the array address corresponding to the defective column 14 to the address of a redundant column 16. After the defective column 14 is disabled and the redundancy logic 6 programmed, whenever the defective column 14 is addressed the redundant column 16 will be accessed instead, allowing data to be read from and written to the memory cells in the redundant column 16. In this way, every time a subsequent read or write operation addresses the defective column 14, the redundant column 18 is accessed instead of the defective column. The circuitry, operation, and processes for redundancy programming to replace defective memory cells with redundant cells is well understood by those skilled in the art, and thus will not be described in more detail.

Modern computer systems typically contain hundreds of megabytes (MB) of memory for storing programming instructions and associated data. With so much memory now being contained in computer systems, the likelihood of defective memory cells has increased. For example, 128 MB of DRAM is a typical amount contained in present personal computer systems. Each byte of memory typically includes 8 bits and thus is stored in 8 individual memory cells. Accordingly, there are over $1\times10^9$ DRAM memory cells required to store the desired 128 MB of data. Moreover, these DRAM memory cells are typically accessed hundreds of millions of times per second. Given such a large number of memory cells and the frequency with which the cells are accessed, the probability that an error will occur in data being read from or written to the memory cells is fairly high.

As previously mentioned, the ECC logic 4 adds error bits to the stored data word 2, with the error bits being redundant information that allows errors in the data stored in the memory 8 to be detected and in some cases corrected.

Referring again to FIG. 1, the ECC logic 4 performs error-correcting operations on data words 2 used by application programs (not shown) accessing the memory 8. In general, referring to FIG. 3 a typical embodiment of the ECC logic 4 is shown in more detail to describe the conventional way errors are detected and corrected. A data input signal DI, which corresponds to the data word 2 in FIG. 1, is a word M bits long and there are an additional K bits added to the word that are used to detect and correct data bit errors. An encode function 72 is the algorithm used to generate or properly set the additional K bits based upon the original M bits. After encoding of the data word DI by the encode function 72, M and K are both stored in memory 8. At some subsequent time, M and K are both read from memory 8, such as by an application program, and the read M bits are presented to a buffer 80 in a corrector unit 78 and are also presented to an encode function 74, which is identical to encode function 72 and generates K bits based on the bit values of the read M bits. The compare unit 76 compares the K bits generated by encode function 74 to the K bits read from memory 8. If the two sets of K bits have identical values the compare unit 76 signals the corrector unit 78 to release the M-bits from buffer 80 without change as a data out signal DO. If, however, the compare unit signals the corrector unit 78 that the two sets of K bits have different values, the corrector unit corrects the M bits in buffer 80 based on a correction algorithm and then releases M from buffer 80 as corrected as the data out signal DO. The compare unit 76 also generates an error signal ES in this case, which is utilized by other circuitry (not shown) in the memory system 10 (FIG. 1).

The ECC logic 4 may execute a variety of different error detection and correction algorithms. One common algorithm is an algorithm that utilizes a code known as a Hamming code, which is an error detection and correction code used in many fields. An example of a Hamming code and its use for data storage in a memory 8 will now be described in more detail for the case where the data words 2 to be stored are 16-bit words. Let X be the data word 2 to be stored. X can be represented by a vector $X_e$, the 16 components $X_0$ to $X_{15}$ of which correspond to the 16 bits of the data word 2 to be stored. Five error check bits $C_1(C_0 \ldots C_4)$ are obtained by multiplying a parity control matrix H called a Hamming matrix, of dimensions 5×16, by the vector $X_e$ in the form of a column vector.

Figure 4B:
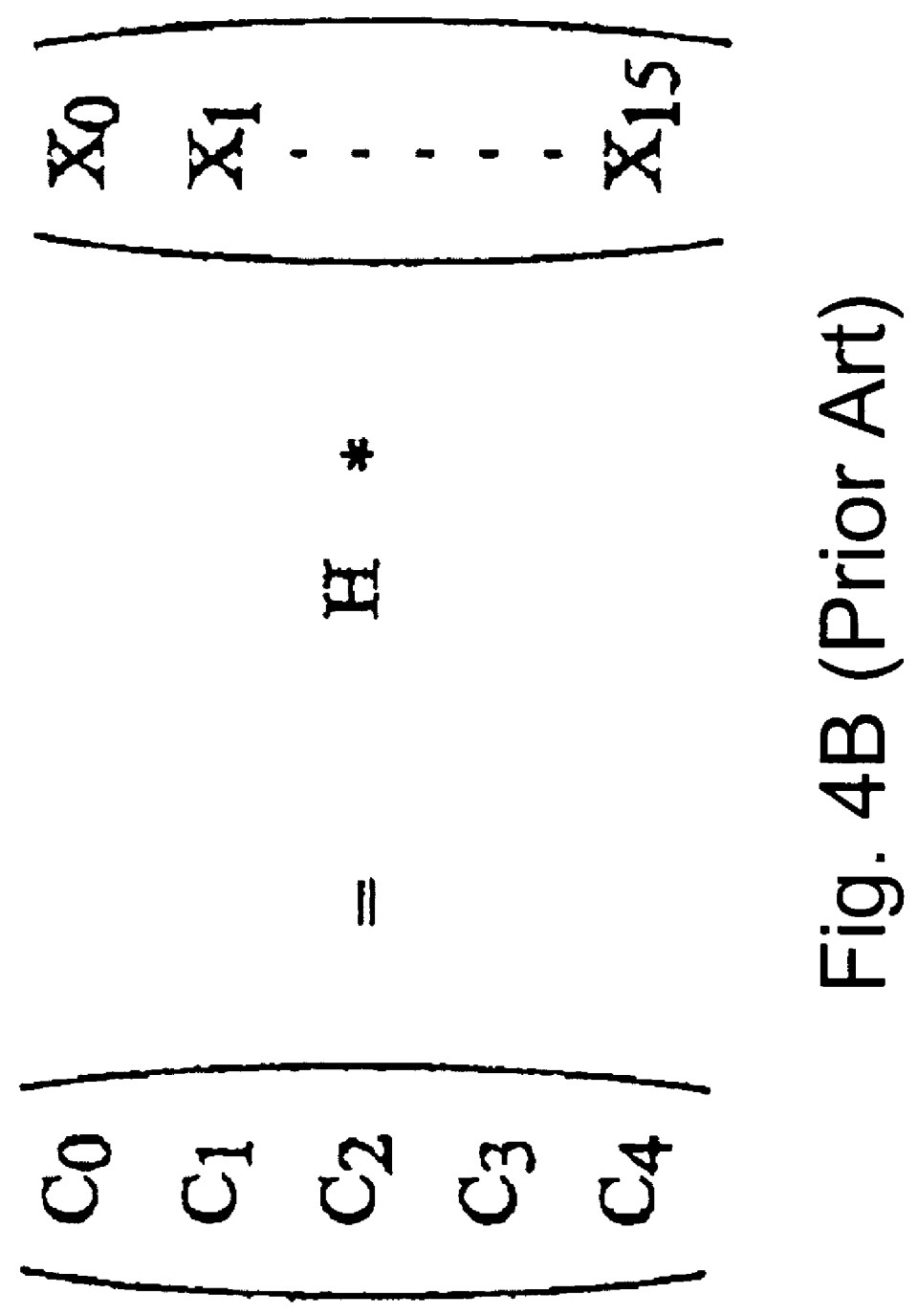

FIG. 4A illustrates the Hamming matrix H for 16 bit data words 2 and the corresponding vectors $X_e$, and FIG. 4B illustrates the way to obtain the error check bits $C_1$ by performing matrix multiplication of $H*X_e$. Calling $h_{ij}$ the elements of matrix H, the error check bits $C_1$ are given by:

$$C_i = \sum_{j=0}^{15} h_{ij} * X_j,$$

with $X_j$ being the $j^{th}$ component of vector $X_e$.

During a write data transfer, 21-bit words formed by the 16 data bits $X_j$ forming the vector $X_e$ and by the 5 check bits $C_1$ generated from the matrix H and the vector $X_e$ are written into the memory 8. In a read data transfer, the read word includes 16 bits $X_r$ corresponding to the data bits read from the memory 8 and 5 bits $C_r$ corresponding to the check bits read from the memory. It is possible for $X_r$ and $C_r$ not to be equal to $X_e$ and $C_1$, respectively, if errors have occurred between the write and read data transfer operations.

To detect and/or correct possible errors in the read bits $X_r$ and $C_r$, a syndrome S with five components $S_0, \ldots S_4$ is calculated by multiplying a determined matrix H' of dimensions 5×21 by a read column vector or "read word" with 21 elements formed by the 16 bits $X_r$ and the 5 check bits $C_r$.

Figure 5A:
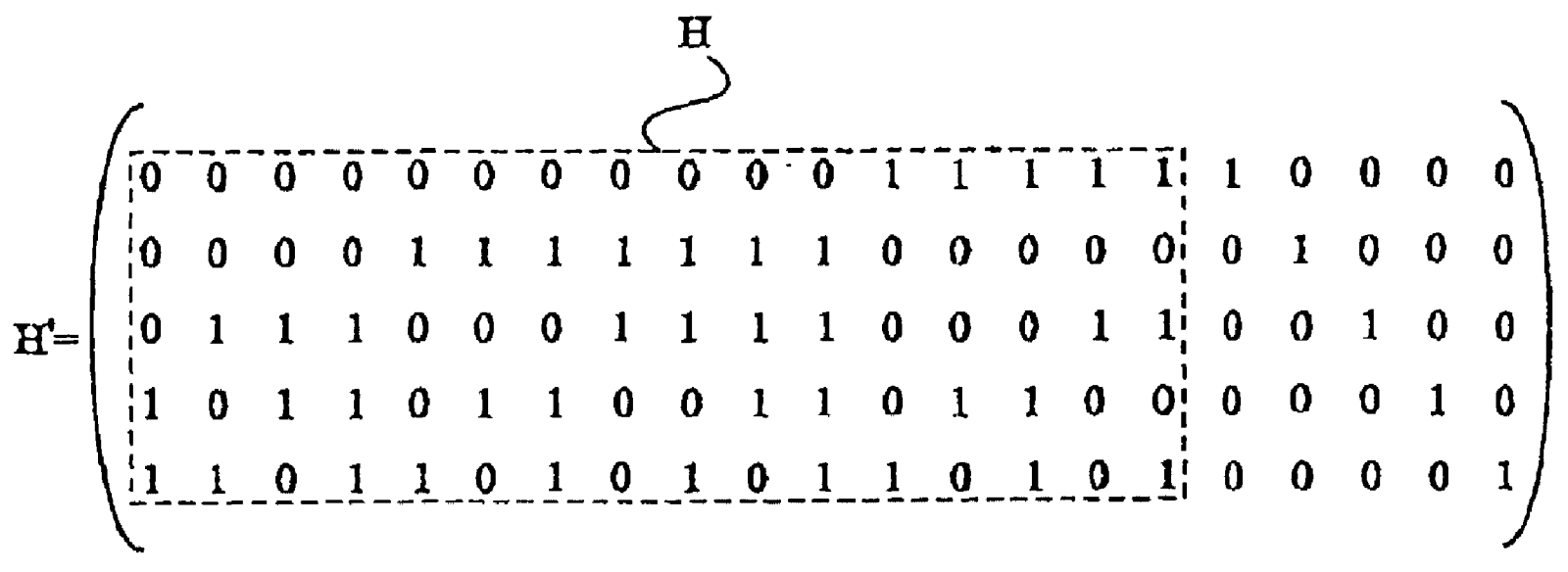

FIG. 5A illustrates the matrix H'. The first 16 columns and all 5 rows of matrix H' correspond to the 16 columns of matrix H as indicated by the dotted lines. The 5 following columns, namely columns 17-21 each include a single "1" on a diagonal from the top left column to the bottom right column as shown. Thus, the $17^{th}$ column has its "1" in the first row, the $18^{th}$ column has its "1" in the second row, and so on until the $21^{st}$ column, which has its "1" in the fifth row. These last five columns of the matrix H' form a 5×5 identity matrix and are used to determine possible errors in the check bits $C_r$.

FIG. 5B illustrates the calculation of a syndrome S.

If syndrome S has all its elements equal to 0, the storage of the read word formed by the 16 bits $X_r$ and the 5 check bits $C_r$ occurred with no errors and all the bits of the read word, be they data bits of the vector $X_r$ or the check bits $C_r$, are correct.

If the syndrome S is different from 0, the read word includes one or more errors. If a single bit of the read word is erroneous, the obtained syndrome S enables correcting the error. Indeed, the syndrome S corresponds in this case to the column in the matrix H' having had its elements multiplied by the erroneous bit. In other words, when a single bit in either the 16 bits $X_r$ or the 5 check bits $C_r$ is erroneous, the syndrome S will have a value corresponding to one of the columns in the matrix H'. Each column in the matrix H' is associated with a particular one of the bits in $X_r$ and $C_r$ and thus the non-zero value of the syndrome indicates the erroneous bit. The matrix H' has columns 1-21 from left to right where the bits $X_0$-$X_{15}$ and $C_0$-$C_4$ are associated with the columns 1-21, respectively. For example if the calculated syndrome is equal to:

$$S = \begin{pmatrix} 0 \\ 0 \\ 0 \\ 1 \\ 1 \end{pmatrix},$$

then the syndrome corresponds to the first column of the matrix H', which is associated with the first bit $X_0$ of the vector $X_r$. Thus, this syndrome indicates that the first bit $X_0$ of the vector $X_r$ is erroneous.

Similarly, if the calculated syndrome is equal to:

$$S'' = \begin{pmatrix} 1 \\ 0 \\ 0 \\ 0 \\ 0 \end{pmatrix},$$

then the syndrome S corresponds to the $17^{th}$ column in the matrix H' which is associated with the first detection bit $C_0$. In this example, the syndrome means that the first detection bit $C_0$ is erroneous. By knowing the erroneous bit from the syndrome S, the erroneous bit can be corrected simply by taking the complement of that bit. For example, if the syndrome S indicates the first bit $X_0$ of the vector $X_r$ is erroneous, then the corrector unit 78 (FIG. 1) may correct this bit by simply inverting the value of bit, such that if the bit is a "0" it is changed to a "1" and if the bit is a "1" it is changed to a "0."

The above-described Hamming code cannot detect two errors. Thus, if an error has occurred in bits $X_1$ and $X_2$, the obtained syndrome S is equal to the sum modulo 2 of the syndromes corresponding to errors on $X_1$ and $X_2$, that is, to:

$S'=(00101)+(00110)=(00011)$.

The obtained syndrome S' indicates an error in bit $X_0$, which is wrong since the errors actually occurred in bits $X_1$ and $X_2$.

Indeed, the above Hamming code is known to gave a minimum code distance d=3 and a linear code like the Hamming code is known to be able to correct L errors and to detect L+1 errors if its minimum code distance d is strictly greater than 2 L+1. Accordingly, for the above Hamming code L=1 and thus the code can detect two errors (e.g., in the above example of bits $X_1$ and $X_2$ being erroneous the syndrome S was non zero and thus indicated that an erroneous bit was present) but can correct only a single error. A linear code is a code in which the sum of two read words equals a valid read word of an overall group of read words that collectively make up the code, as will be understood by those skilled in the art. Similarly, one skilled in the art will understand that the minimum Hamming code distance is the minimum number of bits by which all pairs of read words differ for all pairs of words that collectively make up the code.

To improve the above code and allow more errors to be detected, the minimum distance of the code must be increased. For example, to convert the above code into a code having a minimum code distance d equal to 4, a total parity bit P may be added to each read word.

The total parity bit P for each read word is calculated by adding modulo 2 all the data bits $X_0$-$X_{15}$ and all the check bits $C_0$-$C_4$ or each read word that is part of the overall code. The total parity bit P is added to each word to be stored, and the word to be stored $X_0$-$X_{15}$ the check bits $C_0$-$C_4$, and the total parity bit P are all collectively stored as a word in the overall code.

In a read data transfer, the read word is multiplied by parity control matrix H" shown in FIG. 6A. The matrix H" has one more row and one more column than the matrix H'. The matrix H" includes, to the top left, that is, on the first five lines and on the first 21 columns, a block identical to the matrix H'. The last row D of matrix H" only includes "1 s" and the last column of matrix H" only includes "0 s", except for the last line row which in the row D and is therefore a "1."

The obtained syndrome S' is illustrated in FIG. 6B and has six components $S_0$ to $S_5$ obtained by multiplying the matrix H" by a column vector formed by the 22 bits of the read word. The 22 bits in the read word are the 16 read data bits $X_r$, followed by the five read check bits $C_r$, and finally the read total parity bit $P_r$. The code obtained using the matrix H" is a so-called "Single Error Correction"-"Double Error Detection" ("SEC-DED") code. This code has a minimum code distance d equal to four and can detect two errors in all cases, two errors being indicated by the fact that the last component of the syndrome, $S_5$, is zero while the syndrome S is different from the zero vector.

While the above SEC-DED code allows single errors to be corrected and double errors to be detected, the calculation of the total parity bit P is required. This calculation requires a large number of adders, since all data bits $X_r$ and check bits $C_r$ must be added modulo 2. Further, the calculation of the total parity bit P cannot be performed in parallel with the calculation of the check bits $C_r$, since it requires the previous knowledge of the check bits. Accordingly, it must be awaited that all check bits $C_r$ have been calculated to calculate total parity bit P, which wastes time.

Upon decoding, the calculation of the last syndrome element, $S_5$, requires a large number of additional adders, and this increases the circuitry required for decoding each stored read word which, in turn, increases the area consumed by such decoding circuitry in an integrated circuit. Furthermore, since each addition requires some time, the calculation of the last syndrome element $S_5$ has a relatively long duration and thus undesirably increases the overall decoding time of each read word. This is true of the sixth row of matrix H" in particular because this row consists of all binary "1"s, and each binary "1" requires an associated adder circuit while a binary "0" in the matrix does not require such an adder circuit, as will be understood by those skilled in the art and as will be discussed in more detail below.

It should also be noted that, in the above-described Hamming code, the Hamming matrix is neither symmetrical, nor regular. Thus, considering that the elements of a column in the matrix H" correspond to the binary representation of a number, the variation of this number is not regular from column to column but instead includes jumps. This makes difficult the forming of a circuit implementing the parity control matrix H" as well as the syndrome S decoding.— Systems have been developed using parity control matrices having characteristics that simplify circuitry for implementing the matrix and associated syndrome. For example, FIG. 7A illustrates an example of a parity control matrix M for calculating the check bits C for 16-bit read words in an error correction/detection code. The number of check bits C is equal to 6 and matrix M is a matrix of dimension 6×16. Each column of matrix M is different from every other column and the columns are linearly independent two by two. Furthermore, each column of matrix M is complementary to an immediately adjacent column, except for the first two columns.

The matrix M can be decomposed into eight couples $A_i$ of two adjacent columns, with i ranging from 0 to 7. The couple $A_0$ corresponds to the columns of rank 0 and of rank 1, couple $A_1$ to the columns of rank 2 and of rank 3, and so on through couple $A_7$ to the columns of ranks 14 and 15. In the example of matrix M shown in FIG. 7A, the two columns of a couple $A_i$ are complementary, except for couple $A_0$. The couples $A_1$ to $A_7$ of the matrix M are formed as follows. The first four elements of the first column of a couple correspond to the binary representation of rank i of the couple $A_i$. Thus, the first column of couple $A_3$ has its first four elements equal to "0011", which is the binary representation of the number 3.

The first four elements of the first column of couple $A_0$ (column of rank 0) are chosen to be equal to "0011". This choice is not critical. The first four elements of the column of rank 0 may indeed have any value, provided that the column of rank 0 once completed is different from any other column of matrix M or from the columns relative to the check bits of the matrix used for the decoding, M', which will be described hereafter. The choice of ("0011") has the advantage of using a small number of binary "1s", which simplifies the coding and decoding circuits for implementing the matrix M because, as previously mentioned, the number of binary "1s" determines the number of adders required in the coding and decoding circuits. The last two elements of each first column of a couple $A_i$ (columns of even rank) are equal to "10", except for the first and last couples $A_i$ (columns of rank 0 and 14), where they are equal to "01".

Except for the first couple, $A_0$, each second column of a couple $A_i$ is complementary to the first column of the couple. In other words, except for the column of rank 1, the elements of each column of odd rank are the complements of the elements of the immediately preceding column of even rank, and vice versa. For example, the elements of the first column (rank 8) of couple $A_4$ are equal to "010010" and the elements of the second column (rank 9) of this couple are "101101". In FIG. 7A, couple $A_0$ has "001101" as its first column and "111110" as its second column.

It should be noted that the penultimate row of matrix M, referred to as K, having as elements "0110101010101001", is complementary to the last row of matrix M, referred to as L, having as elements "1001010101010110". This provides advantages when calculating a total parity bit, as will be described in more detail below.

When matrix M is multiplied by a column vector of sixteen components $X_0$-$X_{15}$ corresponding to the bits of the word to be coded and six check bits $C_0$-$C_5$ are obtained, which are added to the word to be coded to form a 22-bit coded word. FIG. 7B illustrates a matrix M' used for the decoding the 22-bit coded word to generate the corresponding syndrome S. At decoding, a vector having 22 components, corresponding to the 22 bits of the coded word being decoded (16 data bits $X_0$-$X_{15}$ and 6 check bits $C_0$-$C_5$ after any processing, for example, a storage of the coded word in memory or a transmission of the coded word), is multiplied by matrix M' to form a syndrome S having six components $S_0$-$S_5$. The matrix M' is a matrix of dimension 6×22 with the first sixteen columns forming a block identical to the matrix M. The first five rows of the five next columns (ranks 16 to 20) form a block A of dimension 5×5 that is an identity matrix having "1s" on a main diagonal and "0s" elsewhere. Under block A, the elements of the last row of the columns of rank 16 to 20 are chosen to be equal to "11110", to correspond to the inverses of the elements of the last row of block A ("00001"). The last column of matrix M', which enables correcting an error on the sixth detection bit $C_5$, includes "0s" in the first five rows and a "1" in the last row.

In the matrix M', the columns corresponding to the data bits (i.e., ranks 0-15 of the block corresponding to the matrix M) are complementary two by two, except for the first two, . Further, the last two rows of the matrix M' are also complementary. If the sum modulo 2 of the last two syndrome components, $S_4$ and $S_5$, is calculated, the sum modulo 2 of all the data bits and the check bits of the word to be decoded, that is, a total parity bit $P_r$ is obtained. The total parity bit $P_r$ is here simply obtained and is calculated in approximately half the time as in the case of the corresponding Hamming code previously discussed with reference to the matrix H" of FIG. 6B. Further, upon coding, in contrast to the Hamming code using the matrix H", no total parity bit P is calculated.

If the syndrome S is equal to the zero vector, there are no errors, either in data bits $X_0$-$X_{15}$ or in the 6 check bits $C_0$-$C_5$. If the syndrome S is different from the zero vector and total parity bit $P_r$ is equal to 1, this means that there has been a single error, which can be corrected. Indeed, the syndrome S elements in this case correspond to the elements of the column of matrix M' corresponding to the erroneous bit. If the syndrome is different from the zero vector and total parity bit $P_r$ is equal to 0, two errors are present, which are detected but which cannot be corrected since it is not known which two columns of matrix M' correspond to the erroneous bit in the data bits $X_0$-$X_{15}$ or in the 6 check bits $C_0$-$C_5$.

FIG. 8A schematically shows the principle of a circuit used for the coding the data bits $X_0$-$X_{15}$ to thereby calculate the check bits $C_0$-$C_5$. A coding circuit 100 includes 16 inputs $E_0$ to $E_{15}$, which receive the 16 data bits $X_0$ to $X_{15}$ of the word to be coded. The circuit 100 also includes 6 outputs $C_0$ to $C_5$ providing the six check bits. Each input E is connected to a column of rank i of the circuit 100 and each output $C_j$ is connected to a row of rank j of the circuit. An adder modulo 2 $G_{i,j}$ schematically indicated herein by a circle marked with a cross may be present at the intersection of column i and of row j in the circuit 100. The adders modulo 2 $G_{i,j}$ may be any adders, and formed for example by XOR gates.

An embodiment of one of the adders modulo 2 $G_{i,j}$ is shown in FIG. 8B and includes two inputs $e_{i,j1}$ and $e_{i,j2}$ often respectively called e1 and e2 hereafter for ease of reference. The input e1 is connected to input $E_i$ and input e2 receives the signal present on row j to the left of adder $G_{i,j}$. The adder $G_{i,j}$ also includes an output $s_{i,j}$ located on row j to the right of adder $G_{i,j}$, which will simply be referred to as s hereafter. When there is no adder $G_{i,j}$ at the intersection of column i and row j, column i and row j cross with no influence upon each other. This means that the bit $X_0$-$X_{15}$ provided to the concerned input $E_0$-$E_{15}$ is not used to calculate the corresponding detection bit $C_j$, which simplifies the circuitry required to form the circuit 100. An additional column, a (FIG.8A), located to the left of the column of rank 0 connects input e2 of each first adder $G_{i,j}$ of a row to ground GND.

The operation of circuit 100 will be explained for the calculation of detection bit $C_4$, corresponding to the row of rank 4. Starting from the left, the first encountered adder is adder $G_{1,4}$. The input e2 of adder $G_{1,4}$ is grounded via column a and the input e1 of adder $G_{1,4}$ receives data bit $X_1$ via input $E_1$ of the circuit 100. At the output of adder $G_{1,4}$, s=0⊕$X_1$, which is equal to $X_1$. The signal provided by adder $G_{1,4}$ is applied to the input e2 of adder $G_{2,4}$ in the next adjacent column to the right, and this adder calculates the value $X_1$⊕$X_2$. This process continues from left to right for the adders $G_{i,j}$ in the row of rank 4, until the adder $G_{15,4}$ performs the addition modulo 2 of the result provided by adder $G_{12,4}$ and the data bit $X_{15}$. Thus, $C_4$=$X_1$⊕$X_2$⊕$X_4$⊕$X_6$⊕$X_8$⊕$X_{10}$⊕$X_{12}$⊕$X_{15}$, which corresponds to the multiplication of the fifth row of matrix M by a vector having as elements the bits $X_0$-$X_{15}$ of the word being coded. Generally speaking, the circuit 100 has the structure of matrix M with the circuit rows and columns corresponding to the rows and columns of matrix M, and an adder modulo 2 $G_{i,j}$ being located in each row where the matrix M includes a "1". In other conventional encoder circuits, an adder $G_{i,j}$ is formed for each element in the matrix M and thus is located at an intersection of each row and column.

The advantages provided for the circuit 100 by the fact that adjacent columns of the matrix M are complementary will now be described. Because the columns of the matrix M are complementary except for the first two columns, the adders modulo 2 $G_{i,j}$ of circuit 100 need not be formed in adjacent columns except possibly for the first two columns rank 0 and 1. As a result, each adder $G_{i,j}$ can laterally (i.e., in the direction of the rows) occupy the place of two adders in prior art circuits requiring an adder at the junction of each row and column. Making the adders $G_{i,j}$ larger means components forming the adders, such as transistors, can be physically larger so that the overall operation of the adder is faster. This is desirable because the circuit 100 slows the rate at which code words can be encoded and decoded and thereby lowers the throughput of the data bits $X_0$-$X_{15}$, which is the data being accessed or communicated.

FIG. 8C illustrates the row of rank 4 of the circuit 100, which generates the detection bit $C_4$. Each adder $G_{i,j}$ in this row is shown in the form of a rectangular block. The first adder $G_{i,j}$ encountered is adder $G_{1,4}$ with its input e2 grounded via column a and its input e1 receiving bit $X_1$ via input $E_1$. In FIG. 8C, the columns of the circuit 100 that are not connected to an input of an adder $G_{i,j}$ of the row of rank 4 are shown as dotted lines. The output $s_{i,j}$ of each of the adders $G_{i,j}$ supplies the input e2 of the next adjacent adder to the right, and the last adder $G_{15,4}$ provides the detection bit $C_4$ of the circuit 100. The row of rank 4 of the coding circuit 100 thus includes eight adders ($G_{1,4}$, $G_{2,4}$, $G_{6,4}$, $G_{8,4}$, $G_{10,4}$, $G_{12,4}$, and $G_{15,4}$), with the data bits being used to calculate the detection bit $C_4$ being $X_1$, $X_2$, $X_4$, $X_6$, $X_8$, $X_{10}$, $X_{12}$, and $X_{15}$. All the adders $G_{i,j}$ of the row of rank 4 have a double surface area as compared to prior adders that had to be positioned at the intersection of each row and column of the matrix M.

Although in FIG. 8C, the input e1 of an adder $G_{i,j}$ is located either to the left, or to the right of the adder, all circuit adders may have the same physical structure. In this case, each input e1 is arranged at a same determined location of an adder $G_{i,j}$ such that a set of vias or connections can couple the input to the desired input E to supply the required bit X. The circuit 100 is thus formed of 48 adders $G_{i,j}$ (8 adders per line), all having a same silicon surface area, which is twice that provided by adders positioned at the intersection of each row and column. Furthermore, due to the fact that the coding matrix M has two complementary lines, no total parity bit P is ever calculated upon coding. The 6 check bits $C_0$ to $C_5$ may be calculated in parallel and added to the word X being coded with no additional time loss, as is the case when generation of the total parity bit P is used.

FIG. 9 schematically shows a decoding circuit 110 used for decoding code words formed by the bits $X'_0$ to $X'_{15}$ and the six check bits $C'_0$ to $C'_5$. The circuit 110 includes 22 inputs $E'_0$ to $E'_{21}$ receiving the 22 bits of the word to be decoded (16 data bits $X'_0$ to $X'_{15}$ and 6 check bits $C'_0$ to $C'_5$). The circuit 110 includes six outputs $S_0$ to $S_5$, each providing a component of a generated syndrome S. The circuit 110 shown herein is directly made at the output of a memory, of which only a row 12 of 22 sense amplifiers $SA_0$ to $SA_{21}$ is shown. The sense amplifiers $SA_i$ are each located at the end of a bit line (not shown) and at the end of two complementary bit lines for a DRAM (not shown), and each sense amplifier provides a bit $X'_0$ to $X'_{15}$ of the word $X'$ to be decoded. The sense amplifiers $SA_0$ to $SA_{15}$ provide data bits $X'_0$ to $X'_{15}$ and sense amplifiers $SA_{16}$ to $SA_{21}$ provide check bits $C'_0$ to $C'_5$. The decoding circuit 110 is formed on the same silicon chip as the memory (not shown) in which the coded word including bits $X'_0$ to $X'_{15}$ and $C'_0$-$C'_5$ is stored, and may be an integral part thereof. Each of the inputs $E'_i$ of the circuit 110 is spaced apart from another input by the interval separating two sense amplifiers $SA_i$.

An examination of FIG. 9 shows that almost all adders $G_{i,j}$ of the decoding circuit 110 occupy a surface area which is double that provided by other adders as previously discussed, and adders of double surface area can operate much faster than adders having half their surface area and thereby the decoding circuit operates much faster.

It should further be noted that the number of adders $G_{i,j}$ per row is reduced as compared to prior circuits, resulting in an additional increase in operating speed of the decoding circuit 110. As a comparison, reference will be made to the last row of matrix H" of FIG. 6A, formed of 22 consecutive "1s". Thus, the last row of the corresponding decoding circuit must include 22 small adders $G_{i,j}$ connected in series. In contrast, with the matrix M' the last row of the decoding circuit 110 only includes 13 adders $G_{i,j}$, 9 of which have a surface area which is double that of the adders that would be utilized to implement the matrix H". The increased operating speed of the circuit 100 is thus present at two levels: 1) physically larger and thus faster adders $G_{i,j}$; and 2) fewer adders per row and thus reduced operating time of these series-connected adders. Since the overall calculation time of the decoding circuit 110 corresponds to the sum of the processing times for each of the adders $G_{i,j}$, the circuit operates much faster than a decoding circuit implementing the matrix H" and including many more adders connected in series. Furthermore, the larger surface area of the adders $G_{i,j}$ enables them to operate more reliably.

The code words X, C for the encoding circuit 100 of FIG. 8A and decoding circuit 110 of FIG. 9 are not limited to codes intended for 16-bit data words $X_0$ to $X_{15}$. Indeed, it is possible to define codes enabling the coding words X having any number of bits, as long as at least two consecutive columns are complementary to thereby enable reducing the processing time of the adders for by these columns. For example, it is possible to generalize matrix M of FIG. 7A to code any data word X including an even number of m bits. The number r of check bits C must be at least greater by 2 than the number necessary to binarily represent the number of bits of the word X to be coded. Preferably, r will be equal to its minimum value, to minimize the number of bits required for the code and thereby avoid making the code too "heavy". Thus, when m is equal to 16, four bits are required to binarily represent sixteen possibilities and r is chosen to be equal to 6, as seen previously. For m=32, the number of check bits is chosen to be equal to 7, with there being 5 bits to binarily represent the 32 bits in each word X being coded plus the two additional bits. As another example, for m=128 the number of check bits is equal to 9, with 7 bits representing the 128 bits in each word X being coded plus the two additional bits. The same process applies to words X having any number of bits m, as will be understood by those skilled in the art.

To generalize the matrix M, the number r of necessary check bits is first determined. Then, the matrix M used for the coding is built, so that the first r−2 elements of each column of even rank indicate, except for the first column, the rank of the couple to which the column belongs (a couple $A_i$ of rank i is formed of the column of even rank 2i and of the column of odd rank 2i+1. The rank of the first column is 0, and that of the last columns is m−1. The last two elements of the columns of even rank are equal to "10", except for the column of rank 0 and the column of rank m−2, where they are "01". The first column of the matrix M may be formed of r−4 elements equal to "0", followed by elements "1101". Thus, in the first column of rank 0 in the matrix M, the first two rows are "0"s (r−4=6−4=2) and the elements in rows 2-5 are "1101." The second column of the matrix M, which is the column of rank 1, may be formed of r−4 elements equal to "1" followed by the elements "1110". Accordingly, the in the second column of the matrix M the first two rows are "1"s and the elements in rows 2-5 are "1110." In the matrix M, the columns of odd rank are, except for the column of rank 1, complementary to the immediately preceding column of even rank. It should be noted that the last row of the matrix M is complementary to its penultimate line.

With regard to the matrix M, it should also be noted that the first r−2 elements of the first column of rank 0 may be identical to the r−2 elements of any other column of the matrix M (which is the case in the matrix M of FIG. 7A where the columns of rank 0 and rank 6 have the same elements "0011" in their first four (r−2) rows. This is true as long as the first column is different from all other columns of matrix M and the first four elements of the first column must not be all "0s" and must include more than one "1" so that the column is different from the columns of the matrix M' used upon decoding which correspond to the check bits (i.e., the columns of rank 16-20 corresponding to the identity matrix A in FIG. 7B).

To form the matrix M' used for decoding, the parity control matrix M is used and completed to the right by a square sub-matrix R of dimension rxr. The sub-matrix R includes "1s" on its main diagonal from upper left to lower right and "0s" everywhere else except in its last row, where the elements are the complement of those of the penultimate row of the sub-matrix R. The last row of the sub-matrix R thus includes "1s" everywhere except at the penultimate column.

The code using matrixes M and M' has a minimum code distance equal to four, which enables correcting one error and detecting two errors. Upon decoding, the obtained syndrome S has r components. A total parity bit P is obtained by adding modulo 2 the last two syndrome components. If the syndrome S is the zero vector, there is no error in the data word X or check bits C. If the syndrome S is different from the zero vector and the total parity bit is equal to "1", there is a single error. This error is easily corrected since the syndrome S corresponds to the matrix column having had its elements multiplied by the erroneous bit. If the syndrome is different from the zero vector and the total parity bit is equal to "0", two errors are present and, while detected, cannot be corrected.

Figure 10:
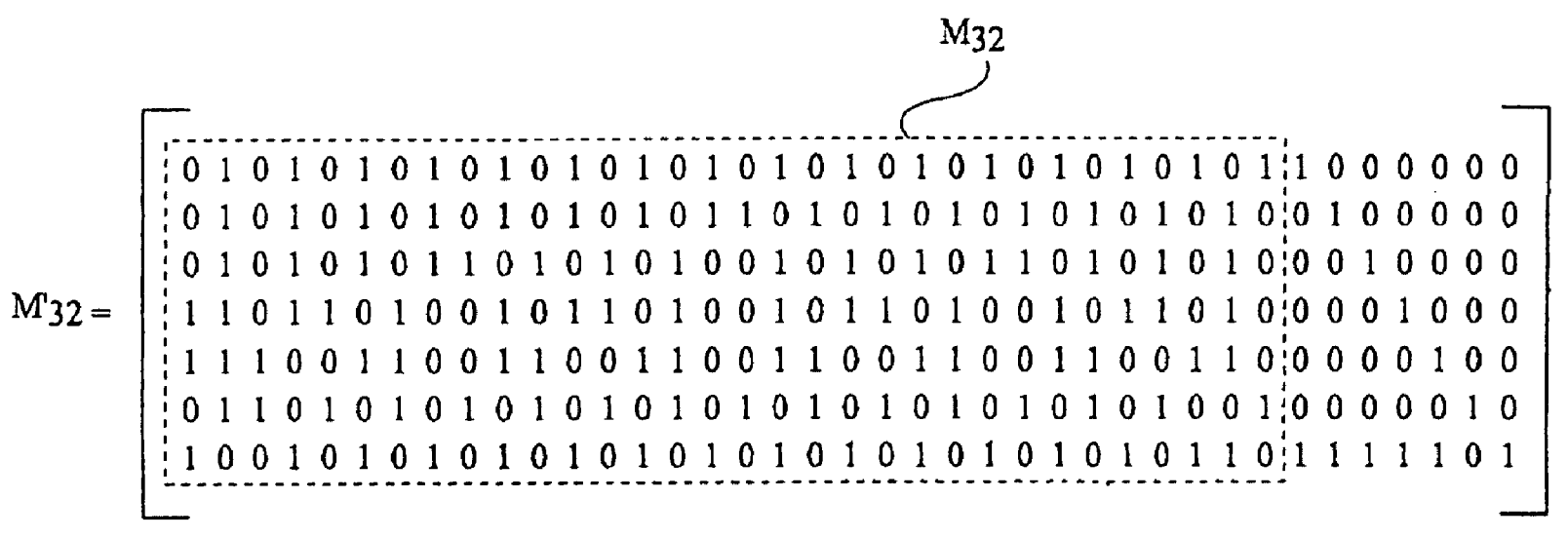

FIG. 10, as an example, illustrates a matrix M'32 used to decode 32-bit data words. The matrix M'32 has dimensions 7×39, and its first 32 columns correspond to the matrix M32 used upon coding. The matrices M32 and M'32 are formed on the model of what has been previously described. The corresponding coding and decoding circuits, not shown, are easily deduced from matrixes M32 and M'32 by means of the principles defined in relation with FIGS. 8A-8C and 9.

Any row permutation in a parity control matrix formulated according to this process may be utilized Similarly, any column permutation in such a matrix may also be done provided that at least two consecutive columns remain complementary. The number N of bits of the word to be coded may be even or odd. If the number N is odd, a matrix M such as described above with an even m equal to N+1 may first be formed, and then the matrix N to be used upon coding can easily derive from matrix M by suppression of any column, such as the first column.

Typically the ECC logic 4 (FIG. 1) that implements the matrices M and M' is performed on the data word X of the width used by the application. A problem with using Hamming codes on relatively short words is that a larger percentage of storage capacity is required for the check bits. For example, if the application utilizes 8-bit data words, then 5 check bits are required for the SECDED logic executed by the ECC logic 4, which accounts for 62% of the total memory storage capacity. A 256-bit word, however, requires only 10 check bits for SECDED logic, which is only 4% of the memory storage capacity. Thus, there is a need for applying wide data words X to the ECC logic 4 to minimize the percentage of overall memory that is used by the codes generated by the ECC logic.

In the matrix M of FIG. 7A, the first two columns are not complementary. This is contrary to the one of the primary goals of this matrix, which is uniform density of "1s" and "0s" so that the distribution and operation of the adders $G_{i,j}$ is improved. Particularly when the ECC logic 4 operates on wide data words X, uniform density is even more important to the large number of bits in each data word and the potential for delays caused by additional adders $G_{i,j}$, as well as the improved physical layout of the adders that is possible when the density of the "1s" and "0s" is uniform.

Another issue when dealing with wide data words X using the matrix M is the number of gates and adders $G_{i,j}$ needed to implement encoding matrix M and decoding matrix M'. There is a particular need to minimize the number of components in ECC logic 4 operating on wide data words X in order to conserve space on semiconductor memory chips in which such circuits must be formed, and to reduce the costs associated with the manufacture of such chips.

There is a need for a parity control matrix for encoding and decoding wide data words and that allows for the formation of ECC logic having a reduced number of components and having relatively uniform distribution of such components to improve operation of such logic.

SUMMARY

According to one aspect of the present invention, the number of components required to implement ECC logic for wide data words is reduced first by eliminating duplicate rows and then by eliminating "1s" in one of the rows to the extent possible without creating duplicate columns.

According to another aspect of the present invention, an H-matrix is defined for wide word ECC logic with uniform density and a reduced number of components. The H-matrix is incorporated in an encode unit operable to Hamming encode a data word with a 10×528 matrix generated in groups of four columns wherein; a first column is a complement of a second column; the value of the second column ranges from 9 to 271 in increments of two; a third column is a complement of a fourth column; and the value of the fourth column is the same as the value of the second column less one; and wherein a 528-bit bottom row is added to the 10×528 matrix comprising alternating zeroes and ones starting with a zero creating an 11×528 matrix.

BRIEF DESCRIPTION OF THE DRAWINGS

FIGS. 4A and 4B, previously described, respectively show a Hamming matrix H and the way to obtain check bits to code a 16-bit word.

FIGS. 5A and 5B, previously described, respectively show a Hamming matrix H' for calculation a syndrome and the syndrome calculation mode for a 16-bit word.

FIGS. 6A and 6B, previously described, respectively illustrate a Hamming matrix H" used in a code enabling detection of two errors for 16-bit words and the corresponding syndrome calculation mode.

FIG. 7A shows a parity control matrix M for coding a 16-bit word;

FIG. 7B shows a matrix M' used to calculate a syndrome;

FIG. 8C shows a line of the circuit used for the coding;

FIG. 10 shows a matrix M'32 used for the decoding of 32-bit words.

FIG. 12 is an H-Matrix generated in hexadecimal code according to an embodiment of the invention.

FIG. 13 is the start of the H-Matrix of FIG. 12 generated in hexadecimal code according to an embodiment of the invention.

FIG. 14 is the start of the H-Matrix of FIG. 12 generated in binary code according to an embodiment of the invention.

FIG. 16 is the end of the H-Matrix of FIG. 12 generated in binary code according to an embodiment of the invention.

FIG. 18 is a shifted H-Matrix generated in hexadecimal code according to an embodiment of the invention.

FIG. 20 is the start of the shifted H-Matrix of FIG. 18 generated in binary code according to an embodiment of the invention.

FIG. 22 is the end of the shifted H-Matrix of FIG. 18 generated in binary code according to an embodiment of the invention.

FIG. 23 a shifted H-Matrix generated in hexadecimal code with zeros in row 2 according to an embodiment of the invention.

FIG. 25 is the start of the shifted H-Matrix of FIG. 23 generated in binary code with zeros in row 2 according to an embodiment of the invention.

FIG. 27 is the end of the shifted H-Matrix of FIG. 23 generated in binary code with zeros in row 2 according to an embodiment of the invention.

DESCRIPTION OF THE INVENTION

Figure 11:
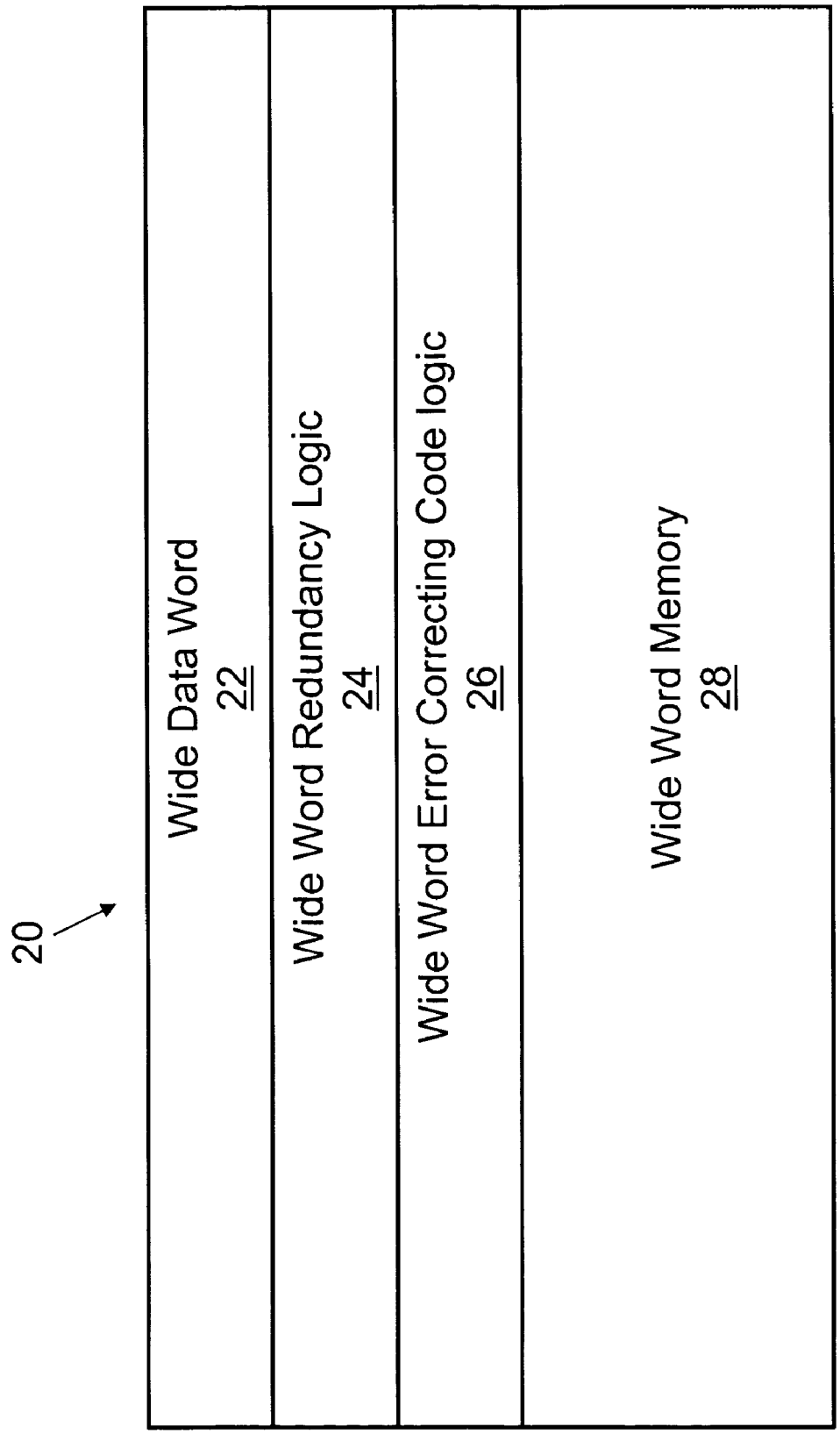
FIG. 11 a block diagram of a memory showing the processing order for redundancy and ECC logic in wide word data I/O operations according to an embodiment of the invention.

FIG. 11 a functional diagram showing components of a wide word memory system 20 that receives wide data words 22 for storage. Each wide data word 22 may, for example, be formed by sixteen 32-bit words that are concatenated or multiplexed into a single 512-bit word prior to storage in a memory 28. If stored in a conventional manner using a SECDED code, each of these sixteen 32 bit words would require 7 check bits. However, the single 512-bit wide data word 22 requires only 11 check bits. Moreover, the memory system 20 includes ECC logic 26 that includes circuitry (not shown) for implementing a parity-control matrix H for encoding and a corresponding matrix H' for decoding. The circuitry of the ECC logic 26 has a reduced number of components, which reduces the area required to form this logic circuitry on a semiconductor memory chip and also improves the speed and reliability of such circuitry, as will be explained in more detail below.

When a wide data word 22 is applied to the memory system 20, the word is first presented to error correcting code (ECC) logic 26 before being written into the memory 28. The ECC logic 26 generates error checking and correction or check bits using the data word 22, and these additional check bits are then stored in the memory 28 along with the wide data word 22. Recall, the data word 22 and associated check bits are collectively referred to as a code word. The code word is stored in specific locations in the memory 28 as programmed by redundancy logic 24, which redirects data to redundant storage locations in the memory to thereby replace defective storage locations, as previously discussed. In this way, the redundancy logic 24 replaces defective storage locations to which data was initially directed with redundant storage locations. When the stored code word is subsequently read from the memory 28, the word is again presented to the ECC logic 26 to ensure the code word read from the memory is the same as the code word initially stored in the memory.

The described embodiment of the present invention is for 528-bit wide data words 22, although the width of the data words along with the parity-control matrix H and corresponding ECC logic 26 may vary for encoding and decoding wide data words of different widths. The ECC logic 24 enables optimization of the size and number of elementary calculation units or adders $G_{i,j}$ (not shown) utilized in the encoding and decoding circuits (not shown). The ECC logic 24 implements a SEC-DED code which is simpler than a corresponding Hamming code, as will be described in more detail below.

Figure 12:
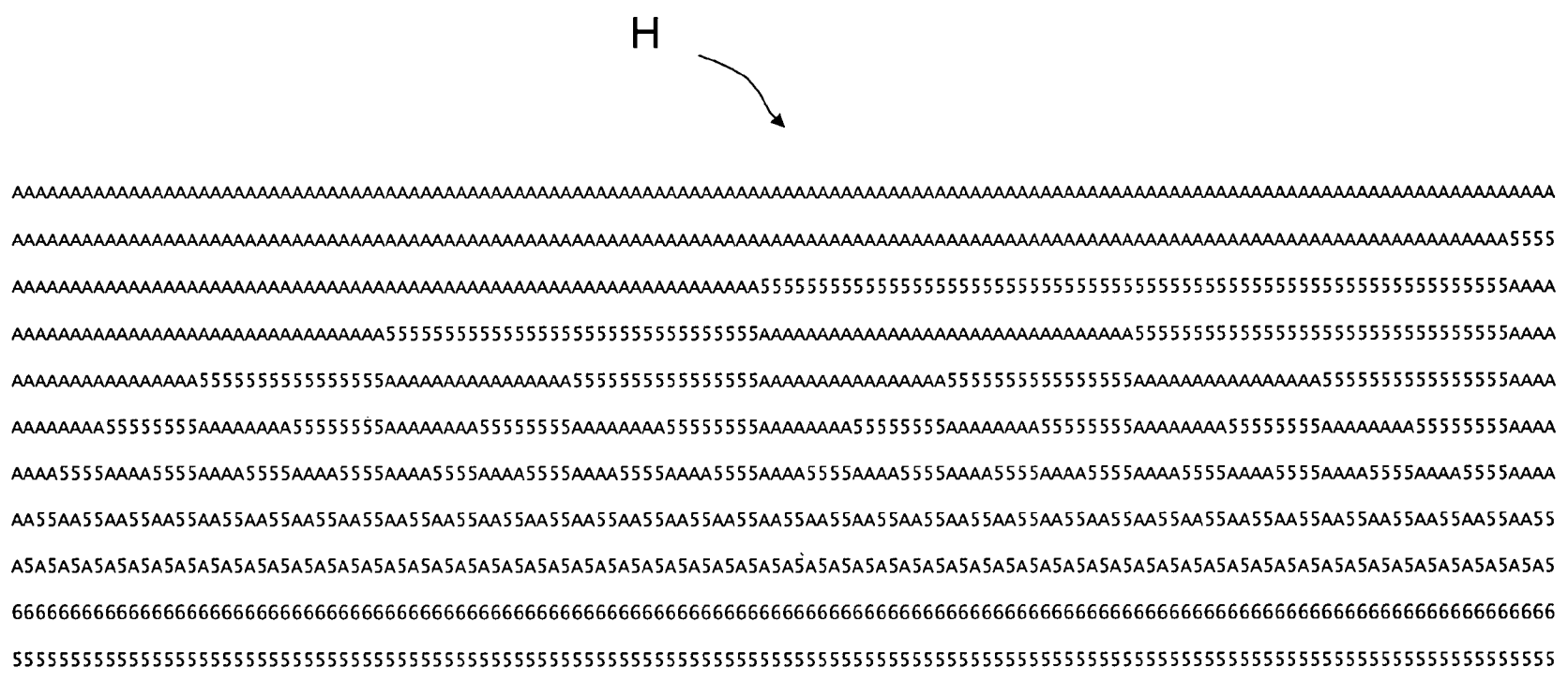

The process for constructing the parity-control matrix H according to one embodiment of the present invention will now be described. The process generates a family of 528-bit word matrices H, each of which may vary but all of which share certain common characteristics. FIG. 12 is a diagram showing the matrix H according to one embodiment of the present invention. The diagram illustrates that the matrix H includes 11 rows and 528 columns, with the elements forming these rows and columns being shown in hexadecimal form. Accordingly, the depicted matrix H includes 11 rows and 132 columns of hexadecimal values, with each hexadecimal value being either an A, 5, or a 6 to provide relatively uniform distribution of bits throughout the matrix and thus relatively uniform distribution of adders or other circuitry (not shown) that are contained in the ECC logic 26 (FIG. 11) to implement the matrix, as will be described in more detail below.

The number D is the number of data bits in each wide data word 22 and the number C is the number of check bits generated for each data word. The SECDED code implemented by the parity-control matrix H generates n+2 check bits C for $2^{}n$ data bits. For data words 22 between 2=512 data bits to 2=1024 data bits, the present SECDED code generated by the matrix H therefore includes 12 check bits because for D=528 bits then n=10 so that C=10+2=12. Decoding a code word generated using the matrix H also requires a check bit matrix formed by an 11×11 identity matrix in a 12×12 matrix with the last column of this matrix being zeros except in the final row, which is row 12 and which is the complement of row 11** and thus has the values '111111111101'.

Figure 1:
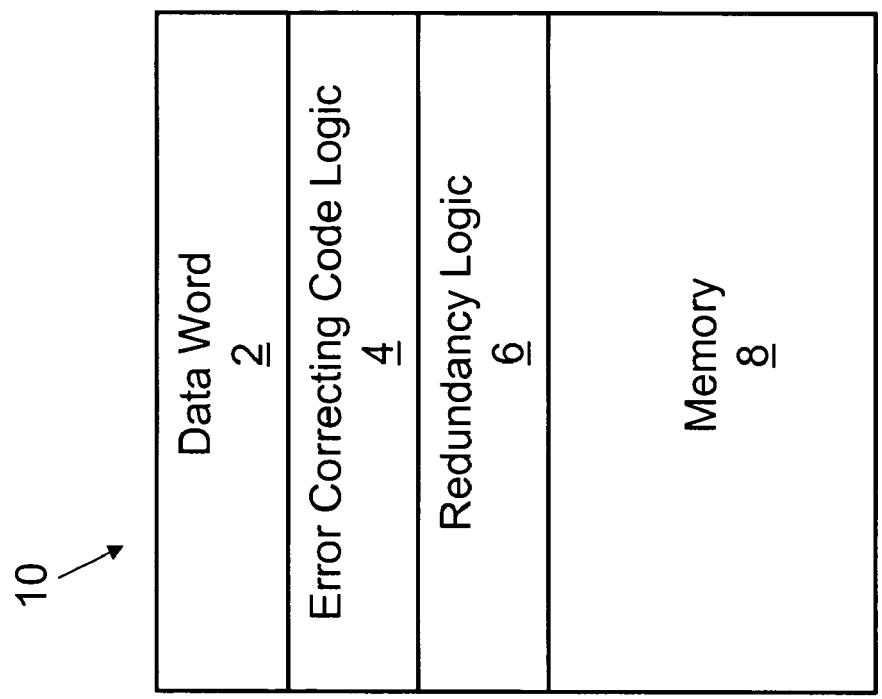
FIG. 1 is a block diagram showing the processing order for ECC and redundancy logic in conventional data I/O operations.
Figure 2:
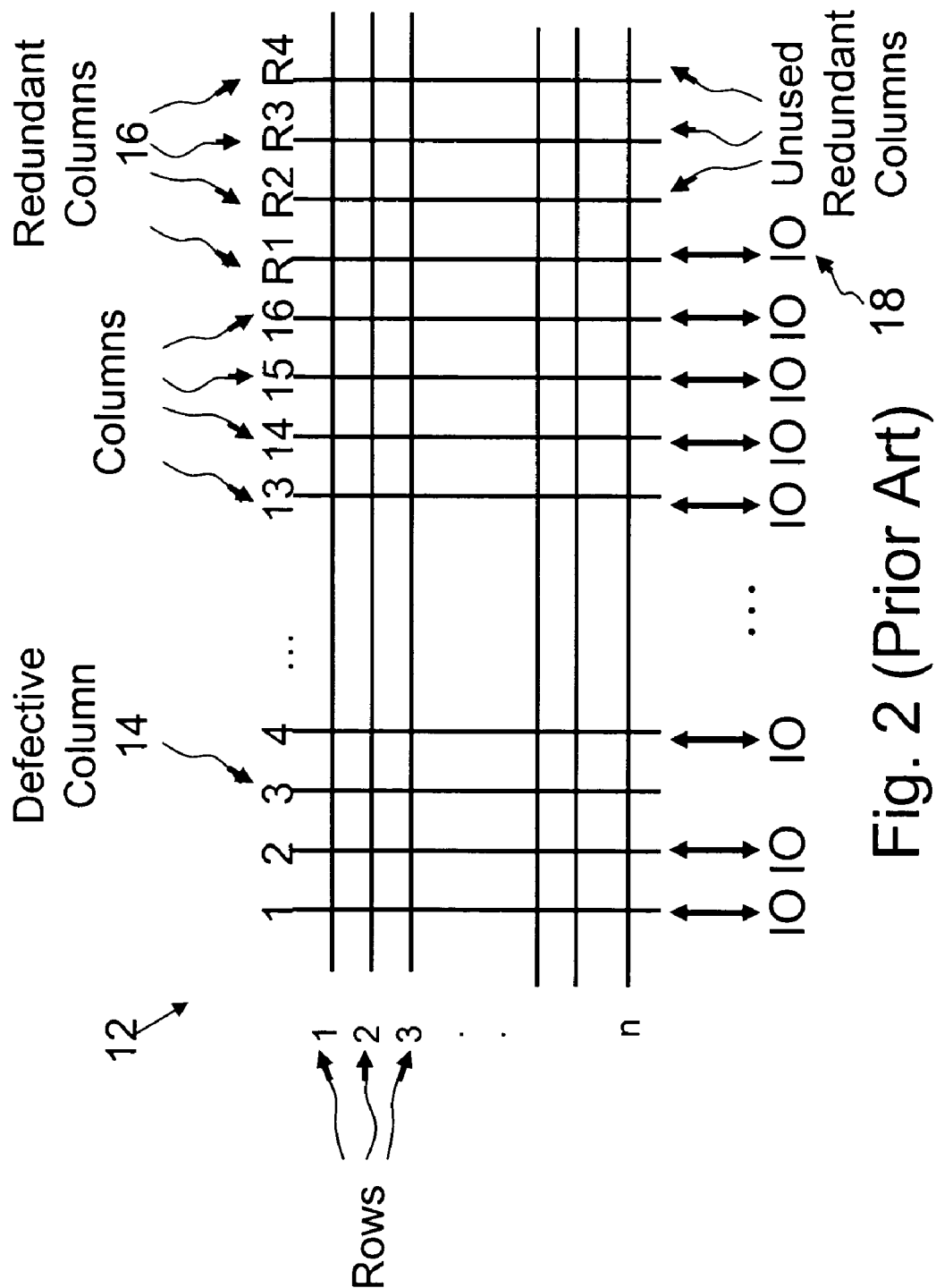
FIG. 2 is a diagram of the memory array of FIG. 1 showing the conventional way redundant columns replace columns with defective bits.
Figure 3:
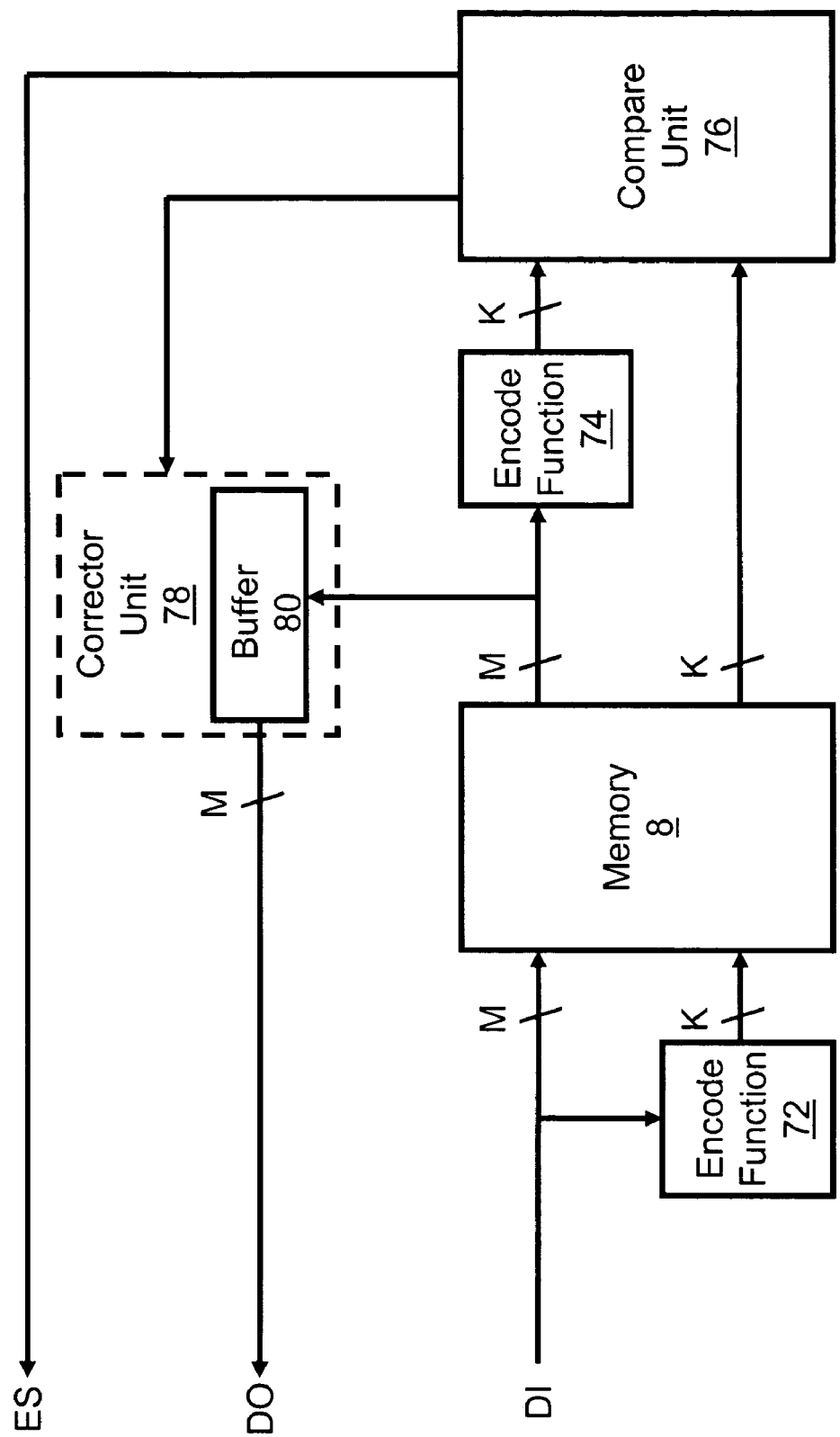
FIG. 3 is a diagram of the error correcting code logic of FIG. 1 showing the conventional way errors are detected and corrected.
Figure 6A:
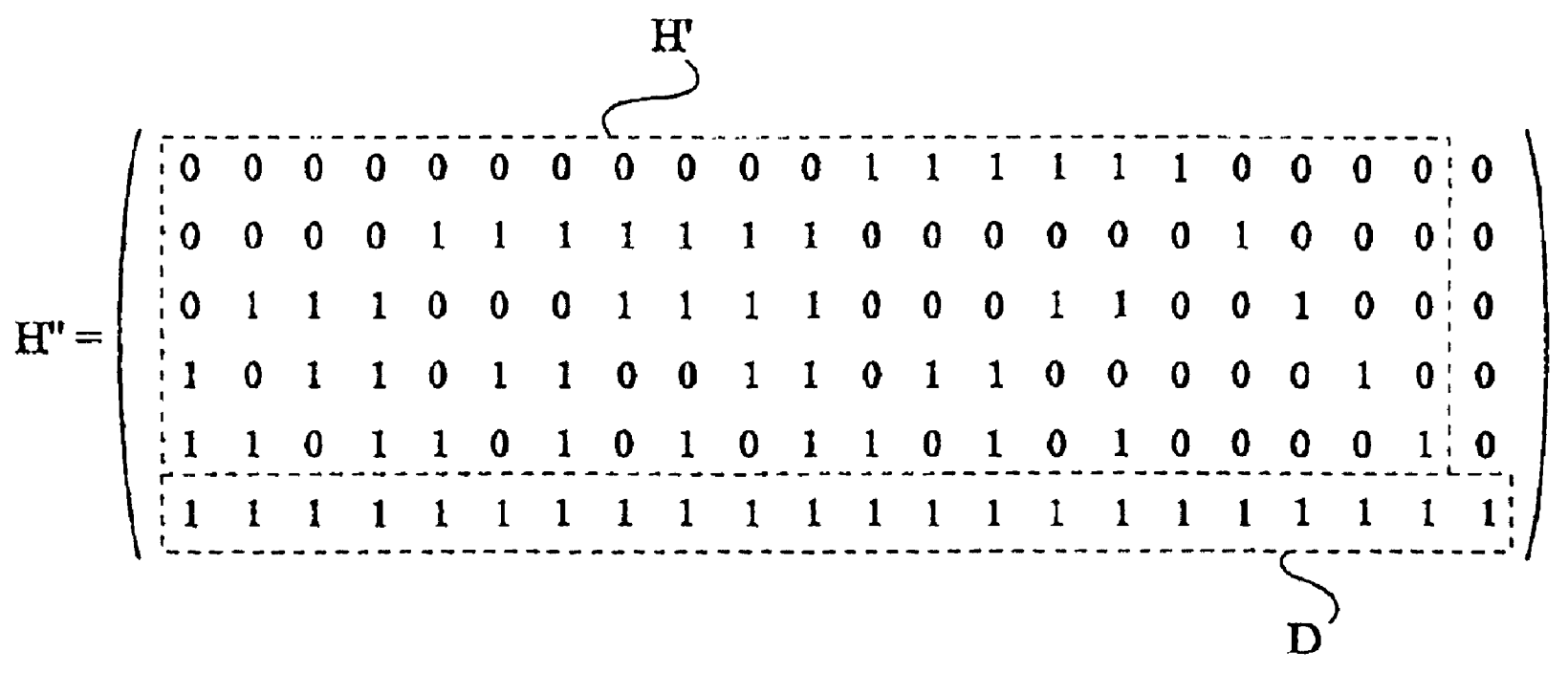
Figure 6B:
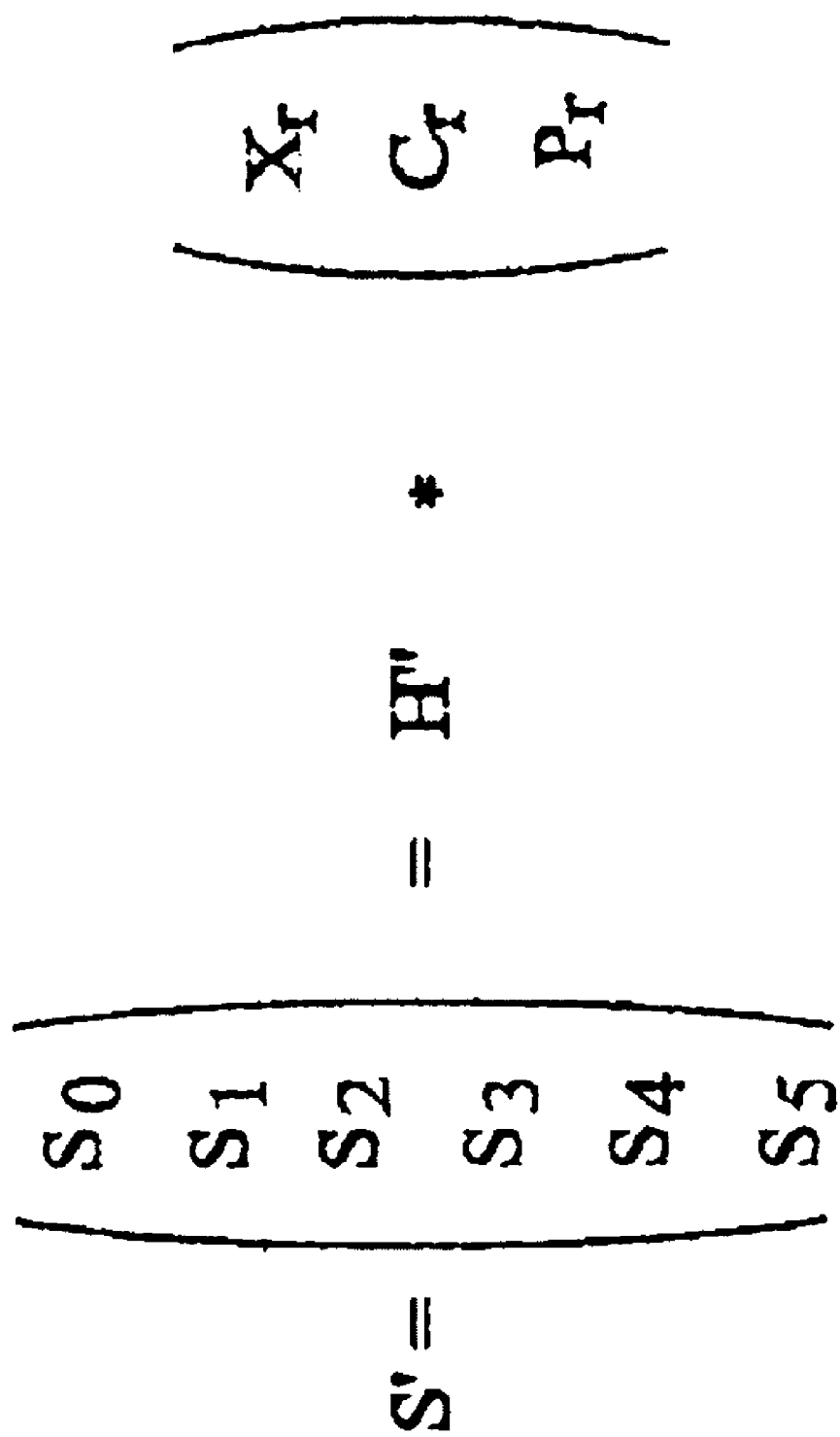

Normally, a check bit matrix is appended onto the end of the matrix H to provide a matrix H' for decoding a code word formed by the data bits D and check bits C, as previously described with reference to FIGS. 6A and 7B. In the described embodiment of the present invention, the matrix H' may be viewed as an 11×540 matrix where each row consists of 528 bits of data (D=528) and 12 check bits (C=12). Although the matrix H' may be viewed as an 11×540 matrix, note that the matrix must in theory include 12 rows so that there is one row in the matrix for each of the check bits C, as required by the rules of matrix multiplication. With the described process, however, the check bit C12 corresponds to a total parity bit that is calculated by the sum of the first check bit C1 and the check bit C11. This sum yields the total parity check bit C12 because the bits in rows 1 and 11 of the matrix H are complementary and therefore the sum of the bits in these rows provides the sum of all the bits D and C1-C11 to yield a total parity check bit C12 for the bits D and C1-C11, as will be understood by those skilled in the art.

FIG. 13 is a diagram illustrating the hexadecimal contents of the first 88 columns and 11 rows of the matrix H according to the embodiment of FIG. 12. This diagram merely illustrates the contents of these first 88 columns in hexadecimal for reference to the same columns after the columns in the matrix H have been shifted to ensure each column in unique, as will be described in more detail below.

Figure 14:
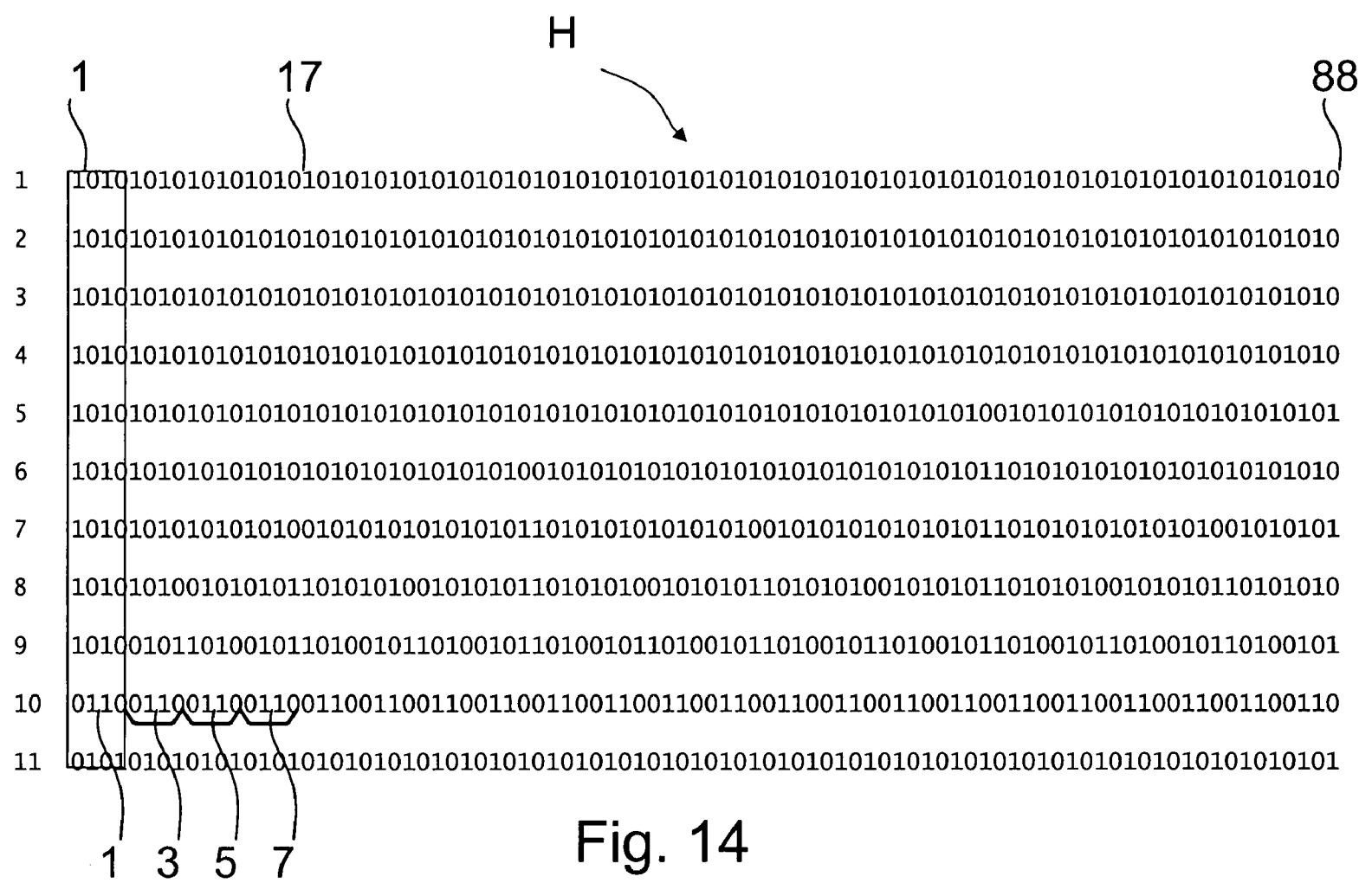

FIG. 14 is a diagram showing the binary contents of the first 88 columns and 11 rows of the matrix H according to the embodiment of FIG. 12, and . This diagram will now be referred to in discussing the general rules by which the matrix H is formed. Various matrices H may be formed according to alternative embodiments of the present invention, but each of these matrices is formed according to the following general rules:

1) In the matrix H, the rows are numbered from row 1 at the top to row 11 bottom (11);

2) In the matrix H, the columns are numbered from column 1 on the left to column 528 and the matrix H' through column 540 on the right including the 12 check bits;

3) In the matrix H, pairs of adjacent columns are required to be complements of each other. For example, in FIG. 14 note that columns 1 and 2 are complements, as are columns 3 and 4, and so on for all the columns;

4) In the matrix H, there are no duplicate columns, and columns of the matrix H may shifted to ensure this property according to one embodiment of the invention, as will be described in more detail below;

5) The columns of the matrix H for the rows 1 to 10 are generated in groups of four as follows:
   a. The first column in each group is the complement of the second column in the group;
   b. The second column in each group includes the binary bits having decimal values that range from 1 to 263 in increments of two, with the bit in row 10 being the least significant bit and the bit in row 1 being the most significant bit. For example, as shown in FIG. 14 the bits in rows 1-10 in the second columns in first four groups from the left, namely columns 2, 6, 10, and 14, have are the binary values 1, 3, 5, and 7, respectively.

Figure 15:
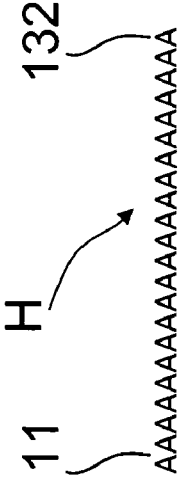
FIG. 15 is end of the H-Matrix of FIG. 12 generated in hexadecimal code according to an embodiment of the invention.

FIG. 15 shows the final 88 columns of the matrix H of FIG. 12 in hexadecimal form and FIG. 16 shows the final 88 columns in binary form. Referring to FIG. 16, the second column in the final group of four columns, which is column 526, has a binary value "0100000111" corresponding to the value 263;
   c. The third column in each group is the complement of the fourth column in the group; and
   d. The fourth column in each group is the same as the second column in the group minus one. For example, column 2 has the value "0000000001" where row 1 corresponds to the leftmost 0 and row 10 to the final 1 and therefore column 4 has the value "0000000000," as seen in FIG. 14

6) The matrix H is shifted left S bits to ensure that each column is unique, where S is the number of bits by which each row in the matrix H is shifted to the left and is given by S=N−D−C where D is the number of data bits and C is the number of check bits, and N is a total number for each row equal the total number of bits D+C plus the number value S by which reach row is shifted. The pattern of bits in each row is preserved in the shift, as will be described in more detail below. If N=D+C+S is greater than $(2^C)/2$ then the shift of the matrix H will cause duplicate columns. In the present embodiment, C=12 so $(2^{12})/2$=2048. In one embodiment, S=16 so the matrix H is shifted left until the left most column is the complement of 9, which is column 17 of FIG. 14. This column has the value of the complement of 9 since the second column in the corresponding group of four columns is the column 18 and has the value 9. As a check, 528+12+16=556<2048 so a shift of the matrix to the left by S=16 will result in no duplication of columns in the matrix;

7) A number of gates required to implement the matrix H is reduced by replacing the 1s with 0s in row 2 of the matrix H unless such a replacement would result in a duplicate column. This replacement in row 2 can be done in any order, from the right or the left or randomly so long as the replacements do not result in any duplicate columns in the matrix H;

8) The total parity check bit C12 is generated by inserting row 11 having alternating zeroes and ones starting with a zero, as shown in FIG. 14. The first row 1 of the matrix H is the complement of this final row 11 except for the check bit portion (not shown in FIG. 12). Accordingly, the total parity check bit C12 may be generated using the check bits C1 and C11 since these bits are generated using complementary rows 1 and 11 of the matrix H;

A family of matrices H may be generated according to these rules for the value of D=528. The family includes matrices H in which with row 2 has any values with up to a maximum number of zeroes as long as there are no duplicate columns. Moreover, any two rows of the matrix H may be swapped and as may any two columns of the matrix, including the swapping of any two groups of four columns. Also, the elements of the matrix H may be shifted in a circular manner to generate a corresponding matrix that is in the family. There are similar families for any value of D greater than 128 as long as the number of check bits equal the number required by a corresponding Hamming code.

Figure 17:
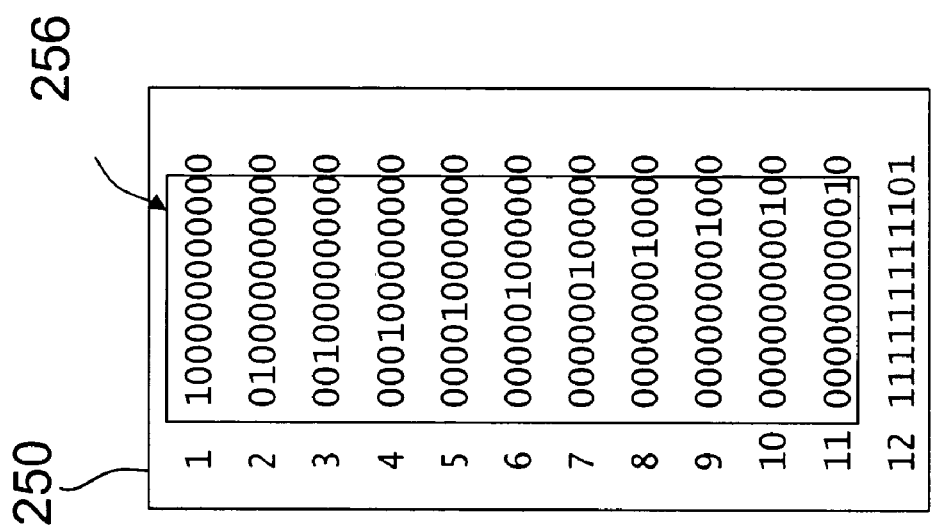
FIG. 17 is the check bit matrix for the H-Matrix of FIG. 12 in binary code according to an embodiment of the invention.

FIG. 17 is a diagram showing a check bit matrix 250 including an 11×11 identity matrix 252 that in combination with the matrix H of FIG. 12 forms the matrix H' according to an embodiment of the present invention. As previously mentioned, a Hamming SEC-DED code generated according to an aspect of the present invention requires that each column of the matrices and H' must be unique. With the present matrix H' formed by the matrix H of FIG. 12 and the check bit matrix 250 of FIG. 17, column 4 of the matrix H as shown in binary form in FIG. 14 is identical to column 11 of the identity matrix 252, both values the values "00000000001" in rows 1-11, respectively. In the previously described matrix M of FIG. 7A, the first and second columns are made non-uniform in order to ensure that all columns in the matrix are unique. In contrast, according to one aspect of the present invention, the entire matrix H is shifted to the left by some number S until all columns in the matrix are unique, as will now be described in more detail.

Figure 18:
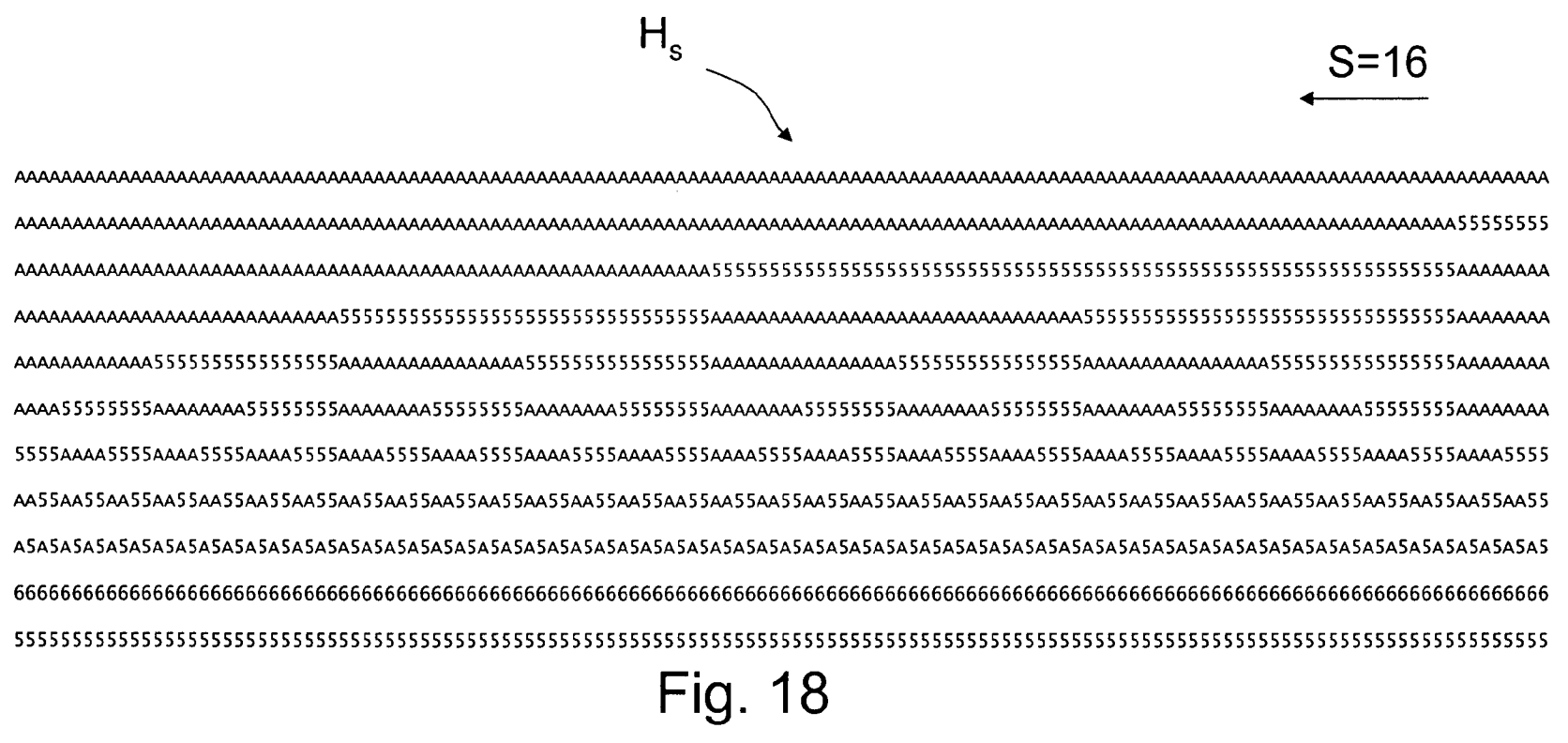

FIG. 18 is a diagram showing an 11×528 matrix $H_s$ in hexadecimal code generated according to the rules set forth above and shifted to ensure that each column of the matrix is unique. Although one of the rules above is to reduce the number of '1s' in row 2, this has not yet been done in the matrix $H_s$ of FIG. 18. The matrix $H_s$ was generated by shifting the matrix H of FIG. 12 to the left by sixteen columns, so S=16. The alternating patterns of 'As' and '5s' again reflect the relatively uniform distribution of bits throughout the matrix $H_s$ which, as previously described, allows for uniform distribution of components required to implement the matrix in hardware. This reduces the number of such components and allows the components to be larger to thereby increase the speed and reliability of the components.

Figure 19:
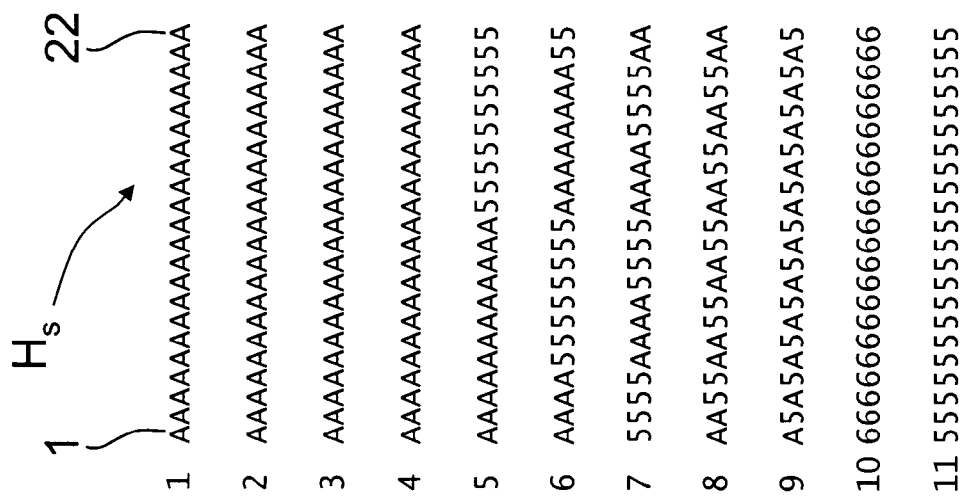
FIG. 19 is the start of the shifted H-Matrix of FIG. 18 generated in hexadecimal code according to an embodiment of the invention.

FIG. 19 illustrates first 88 columns of the matrix $H_s$ in hexadecimal form and FIG. 20 shows these first 88 columns in binary form. The matrix $H_s$ is generated by shifting the matrix H of FIG. 12 to the left by sixteen columns (S=16), such that column 17 ("11111101100") of the matrix Has shown in FIG. 14 becomes column 1 of the matrix $H_s$. Column 2 of the matrix $H_s$ now has the binary value corresponding to the value 9, column 4 has the binary value corresponding to 8 (value of column 2 minus 1), and column 3 is the complement of column 4.

Figure 21:
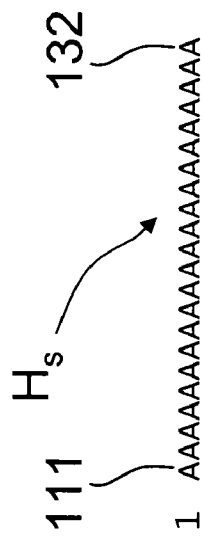
FIG. 21 is end of the shifted H-Matrix of FIG. 18 generated in hexadecimal code according to an embodiment of the invention.

FIG. 21 is a diagram showing the end of the matrix $H_s$ in hexadecimal form and FIG. 22 is a diagram showing the end of the matrix in binary form. FIG. 22 indicates the shift to the left by S=16 columns, and also points out column 512, which corresponds to column 528 in the final 88 columns of the matrix H as shown in FIG. 16. Referring to FIG. 21, when the matrix H is shifted to the left to generate the matrix $H_s$, the bits that fill the column from the right preserve the binary pattern of each row. For example, row 2 is filled in hexadecimal 5s as the row is shifted to the left, and row 9 is filled with the hexadecimal pattern A5A5. This is seen when comparing the last 88 columns of the matrix H as shown in FIG. 15 with the last 88 column of the matrix $H_s$ as shown in FIG. 21. In the matrix $H_s$ of FIG. 21, the row 2 is seen to include four additional hexadecimal 5s at the end when compared to row 2 of the matrix H of FIG. 15, and the same is true of row 7. The leftmost column in FIG. 22 is column 441, and this column is the complement of the next column 442 having binary values corresponding to the number 229. The column 443 is the complement of column 444, which has binary values corresponding to the number 228 which is one less than value 229 of column 442. The column 526 has a binary value "0100001111" corresponding to decimal 271 and column 528 accordingly has a binary value "0100001110" corresponding to 271−1=276, which satisfy the rules for formulating the matrix $H_s$. Thus, the matrix $H_s$ has 132 groups of 4 columns where the second column in each group has a value ranging from 9 in column 2 to 271 in column 526.

Figure 23:
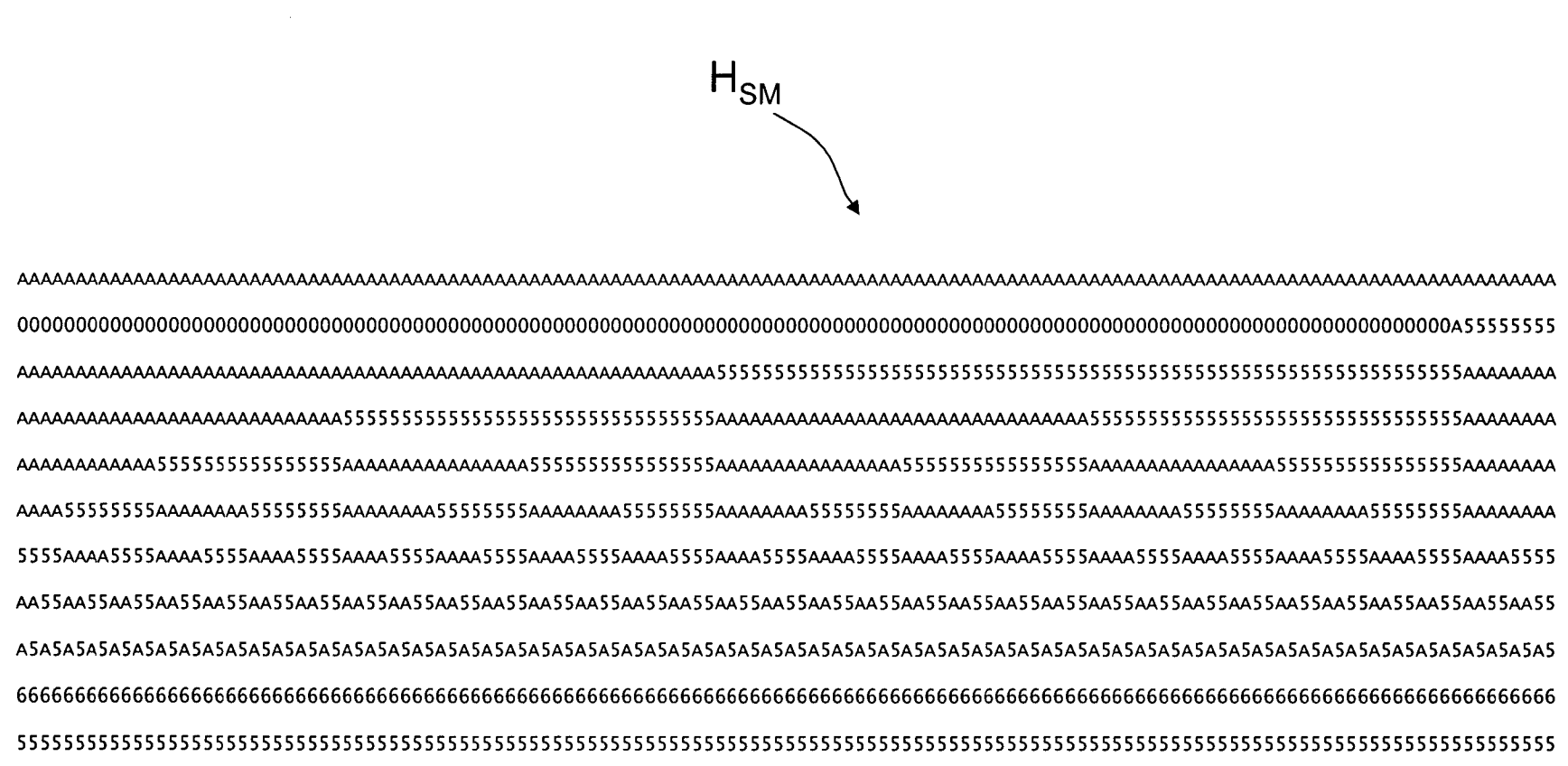
Figure 24:
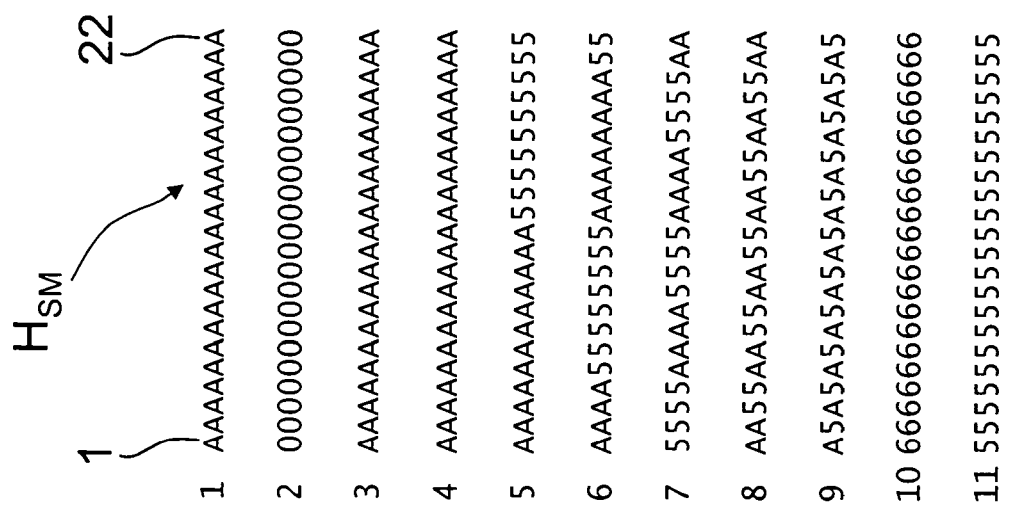
FIG. 24 is the start of the shifted H-Matrix of FIG. 23 generated in hexadecimal code with zeros in row 2 according to an embodiment of the invention.
Figure 26:
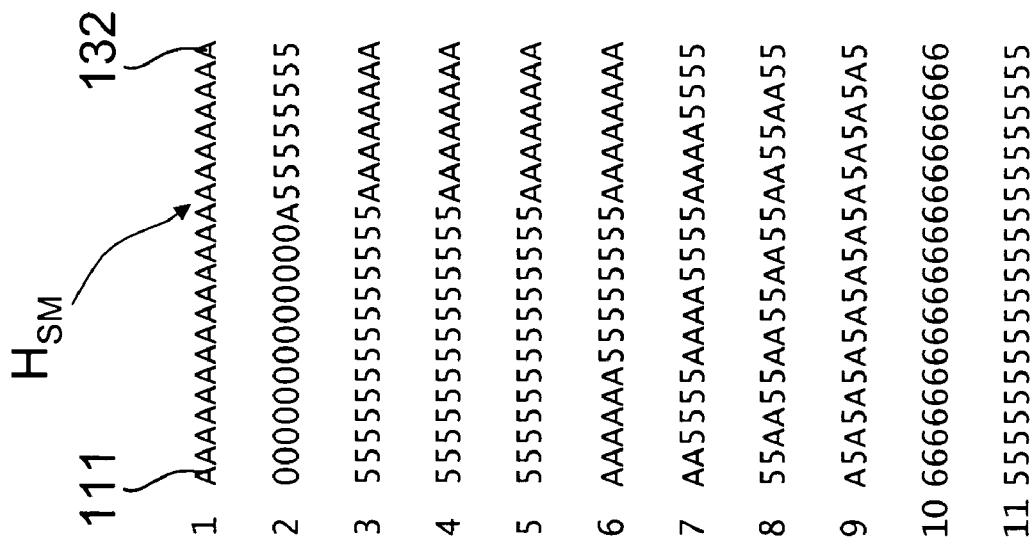
FIG. 26 is end of the shifted H-Matrix of FIG. 23 generated in hexadecimal code with zeros in row 2 according to an embodiment of the invention.

FIG. 23 is a diagram showing a matrix $H_{sm}$ that is generated from the matrix $H_s$ of FIG. 18 by replacing some of the binary 1s in row 2 with binary 0s according to an embodiment of the present invention. Thus, the matrix $H_{sm}$ corresponds to the matrix H of FIG. 12 but shifted to the left by S=16 columns and then replacing 1s with 0s in row 2. FIGS. 24 and 25 show the first 88 columns of the matrix $H_{sm}$ in hexadecimal and binary form, respectively, and FIGS. 26 and 27 show the final 88 columns of the matrix $H_{sm}$ in hexadecimal and binary form, respectively. In the matrix $H_{sm}$, the binary 1s in row 2 were replaced starting with the left most column 1 and continued until such a replacement would result in a duplicate column in the matrix. Accordingly, in the matrix $H_{sm}$ binary 0s were inserted for all binary 1s in row 2 until column 493, because if the binary 1 in row 2 and column 493 was replaced with a binary 0 a duplicate column in the matrix $H_{sm}$ would result. More specifically, if the binary 1 in row 2 and column 493 was replaced with a binary 0, then this column would have the same value as the first column of the identity matrix 252 contained in the check bit matrix of FIG. 17. In the embodiment of FIG. 23, columns 494-528 in row 2 were left with their original value and no additional binary 0s were replaced.

Note that by replacing the binary 1s with 0s where appropriate in columns 1-492, the binary values represented by the columns where such replacements occur change. More specifically, a replacement of a 1 with a 0 results in row 2 for every first and third column in each group of four columns up until column 493, as may be seen by looking at row 2 in the matrix $H_s$ of FIG. 20. As a result, the binary value and accordingly the decimal value of each of these columns changes. This removal of the binary 1s in row 2 decreases the decimal value represented by each of these columns by 256, since the bit in row 2 represents $2^8$ in each binary word represented by rows 1-10.

Figure 8A:
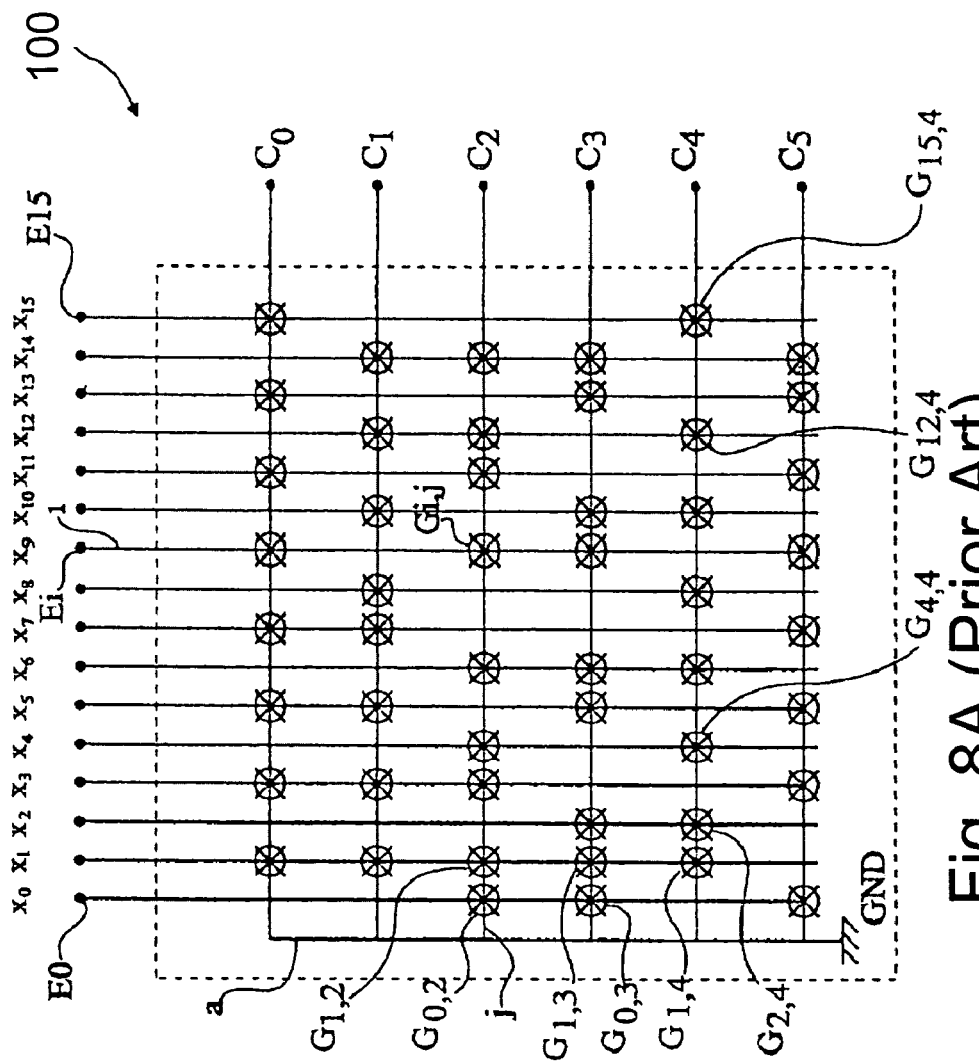
FIG. 8A illustrates the principle of a circuit used for the coding of a word by means of matrix M.
Figure 8B:
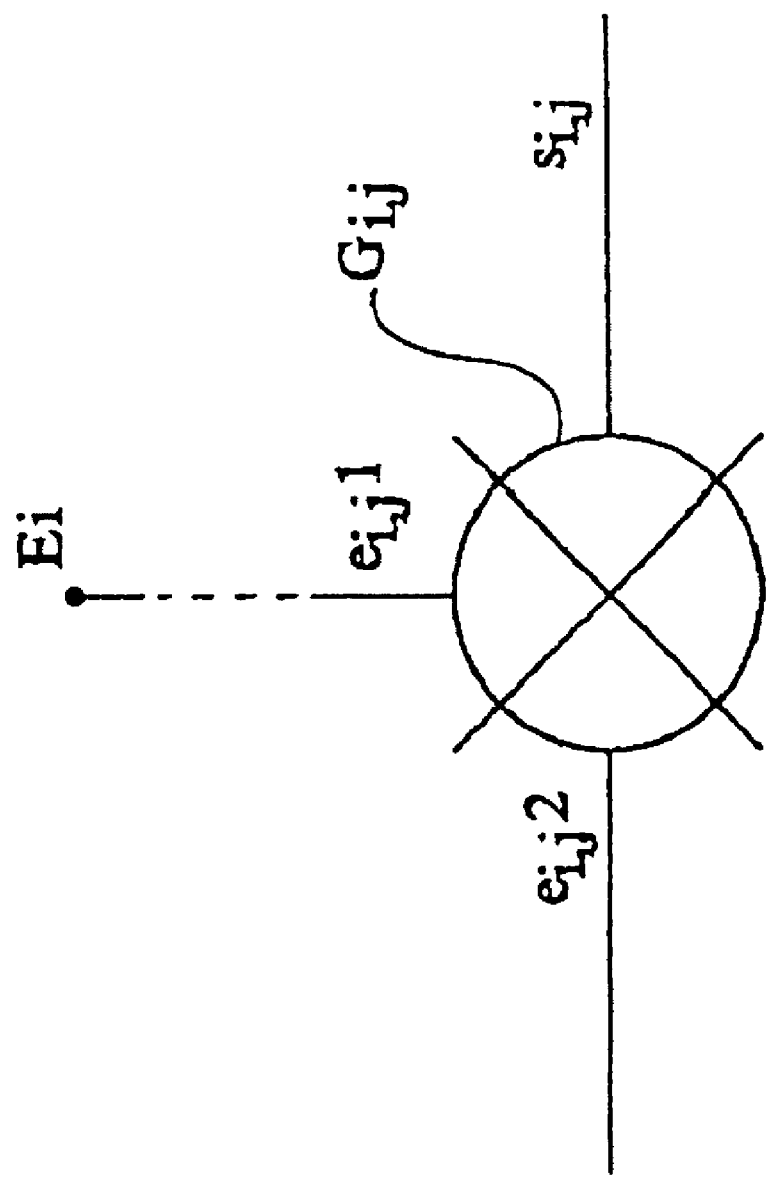
FIG. 8B shows an element of the circuit of FIG. 8A.
Figure 9:
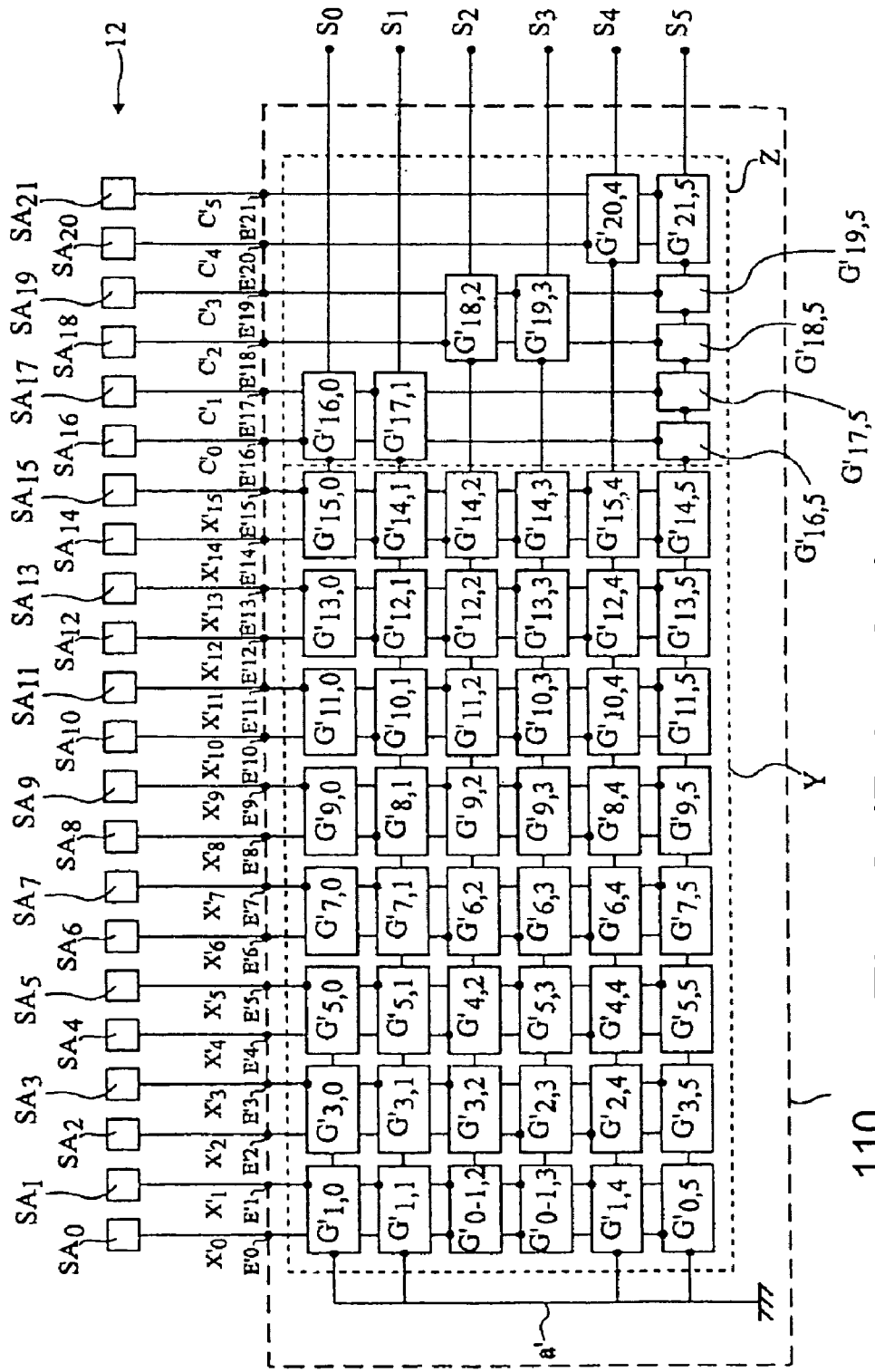
FIG. 9 shows a circuit used to calculate a syndrome.

Referring back to FIG. 11, the ECC logic 26 implements the matrix $H_{sm}$ according to one embodiment of the present invention to generate the check bits C1-C12 that in combination with the 528 data bits D form a code word that is stored in the memory 28. The ECC logic 26 also implements a matrix $H'_{sm}$ formed by the matrix $H_{sm}$ and check bit matrix of FIG. 17 to decode the code words stored in the memory 28, and to correct single bits errors and detect double bit errors in such words. In one embodiment, the hardware implementation of the matrix $H_{sm}$ in the ECC logic 26 is similar to the prior circuits 100 and 110 previously described with in FIGS. 8A-9, with the only difference being that there are not as many adders $G_{i,j}$ because of the elimination of an entire row in the matrix-$H_{sm}$ and further elimination of most of the binary 1s in row 2.

The matrix $H_{sm}$ reduces the number of components contained in the ECC logic 26 to implement the matrix by eliminating the penultimate row contained in the matrix M discussed with reference to FIG. 7A. The ECC logic 26 generates the eleven check bits C1-C11 using the 11×528 matrix $H_{sm}$, and generates the twelfth check bit C12 differently. In the matrix $H_{sm}$ the rows 1 and 11 are complementary and in general the top and bottom rows of any matrix generated according to the above rules are complementary. The ECC logic 26 uses these two complementary rows of the 11×528 matrix $H_{sm}$ to generate the twelfth check bit $C_{12}$, as previously discussed.

During decoding of the code words, the ECC logic 26 operates in the same way as described for the prior art circuits to generate a corresponding syndrome S except that the twelfth syndrome bit S12 is again generated differently using the complementary rows 1 and 11 of the matrix $H_{sm}$ and the corresponding check bits C1 and C11. Just as with any Hamming SEC-DED code, if the syndrome S is equal to the zero vector there are no errors in either the data bits D or in the check bits C. If the syndrome S is different from the zero vector and total parity bit corresponding to the bit S12 is equal to 1, this means that there has been a single error which can be corrected. In fact, the elements of the syndrome S are the same as the elements of the column of the matrix $H_{sm}$ corresponding to the erroneous data or check bit D or C. If the syndrome S does not equal the zero vector and the total parity bit corresponding to the bit S12 is equal to 0, two errors are present in the data and check bits D and C, which is thereby detected but which cannot be corrected.

The described embodiment of the present invention has been described in the context of the storage of the wide data words 22 in a memory system 20. The described parity-control matrix H and associated coding and decoding of data words may be applied to any system using data words for which error correction and detection is desired, such as, for example, in communications system involving the transmission of code words and the decoding of such words upon reception. Moreover, one embodiment of circuitry for implementing a parity-control matrix H according to embodiments of the present invention is described in more detail in U.S. patent application Ser. No. 10/742,595 to Worley entitled METHOD AND SYSTEM TO ENCODE AND DECODE WIDE DATA WORDS, which was filed concurrently with the present application on Dec. 18, 2003 and which is incorporated herein by reference.

The preceding discussion is presented to enable a person skilled in the art to make and use the invention. Various modifications to the disclosed embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

What is claimed is:

1. A circuit, comprising:
    an encode unit adapted to receive a data word and operable to encode the data word using a matrix to generate corresponding check bits, the encode unit including components to implement a matrix having,
    11 rows and 528 columns, the matrix having elements generated in groups of four columns for rows 1-10 wherein for each group of four columns,
        a first column is a complement of a second column;
        the value of the second column ranges from 9 to 271 in increments of two;
        a third column is a complement of a fourth column; and
        the value of the fourth column is the same as the value of the second column minus one;
    row 11 is formed by alternating zeroes and ones starting with a zero in column 1;
    an 11×11 identity matrix concatenated onto end of the 11×528 matrix to form an 11×539 matrix; and
    a last 1×11 column matrix concatenated onto the end of the identity matrix to form an 11×540 matrix;
    a compare unit coupled to the encode unit to receive the generated check bits and adapted to receive a second set of check bits, and operable to compare the check bits from the encode unit to the second set of check bits and to generate an error signal indicating the result of the comparison;
    a buffer adapted to receive and store the data word and operable to provide the data word on an output responsive to an enable signal; and
    a corrector unit coupled to the compare unit and to the buffer and operable to activate the enable signal responsive to the error signal indicating no errors have been detected and operable to correct single bit errors in the data word stored in the buffer responsive to the error signal indicating a single bit error and to thereafter activate the enable signal.

2. The circuit of claim 1 wherein the binary values of the elements of the second column and in rows 1-10 of the matrix is any number greater than 6 and less than 1024.

3. The circuit of claim 1 wherein the ones are replaced by zeroes in the second row of the 11×528 matrix unless there is a duplication of columns in the 11×540 matrix.

4. The circuit of claim 3 wherein some ones in the second row are not replaced by zeroes.

5. The circuit of claim 1 wherein the 528 bits of the first row of the 11×528 matrix are the complement of the 528 bits in row 11 of the matrix.

6. The circuit of claim 1 wherein any two rows of the 11×540 matrix are swapped.

7. The circuit of claim 1 wherein any two columns of the 11×540 matrix are swapped.

8. The circuit of claim 1 wherein there is circular shifting of the 11×528 matrix.

9. The circuit of claim 1 wherein the encode unit further comprises logic to generate a total parity bit using the top row of the 11×528 matrix and the bottom row of the 11×528 matrix and a bottom check bit row of '111111111101'.

10. The circuit of claim 1 wherein the compare unit further comprises logic operable to perform a Hamming SEC-DED decoding.

11. The circuit of claim 1 wherein the corrector unit further comprises logic operable to correct the data word in the buffer based on a Hamming syndrome calculated by the compare unit.

12. A computer memory for storing data for access by an application program being executed on a computer system, the memory comprising:
    a data structure stored in the memory and being used by the application program, the data structure comprising an 11×528 matrix for encoding data words, the matrix being represented by the following elements in hexadecimal form where two consecutive rows of hexadecimal numbers represent a corresponding row of the matrix, the matrix comprising:

```
AAAAAAAAAAAAAAAAAAAAAAAAAAAAAAAAAAAAAAAAAAAAAAAAAAAAAAAAAAAAAAAA
AAAAAAAAAAAAAAAAAAAAAAAAAAAAAAAAAAAAAAAAAAAAAAAAAAAAAAAAAAAAAAAA 0000000000000000000000000000000000000000000000000000000000000000
00000000000000000000000000000000000000000000000AAAAAAAA55555555AAAA

AAAAAAAAAAAAAAAAAAAAAAAAAAAAAAAAAAAAAAAAAAAAAAAAAAAAAAAA5555555555
555555555555555555555555555555555555555555555555555555555AAAAAAAAAAAA
```

```
-continued
AAAAAAAAAAAAAAAAAAAAAAAA5555555555555555555555555555AAAAAAAAAA
AAAAAAAAAAAAAAAAAAAAAAAA5555555555555555555555555555AAAAAAAAAAAA AAAAAAAA5555555555555555AAAAAAAAAAAAAAAA5555555555555555AAAAAAAAAA
AAAAAA5555555555555555AAAAAAAAAAAAAAAA5555555555555555AAAAAAAAAAAA 55555555AAAAAAAA55555555AAAAAAAA55555555AAAAAAAA55555555AAAAAAAA55
555555AAAAAAAA55555555AAAAAAAA55555555AAAAAAAA55555555AAAAAAAAAAAA AAAA5555AAAA5555AAAA5555AAAA5555AAAA5555AAAA5555AAAA5555AAAA5555AA
AA5555AAAA5555AAAA5555AAAA5555AAAA5555AAAA5555AAAA5555AAAA55555555

AA55AA55AA55AA55AA55AA55AA55AA55AA55AA55AA55AA55AA55AA55AA55AA55AA
55AA55AA55AA55AA55AA55AA55AA55AA55AA55AA55AA55AA55AA55AA55AA55AA55

A5A5A5A5A5A5A5A5A5A5A5A5A5A5A5A5A5A5A5A5A5A5A5A5A5A5A5A5A5A5A5A5A5
A5A5A5A5A5A5A5A5A5A5A5A5A5A5A5A5A5A5A5A5A5A5A5A5A5A5A5A5A5A5A5A5A5

6666666666666666666666666666666666666666666666666666666666666666
6666666666666666666666666666666666666666666666666666666666666666

5555555555555555555555555555555555555555555555555555555555555555
5555555555555555555555555555555555555555555555555555555555555555.
```

13. The memory of claim 12 wherein at least some of the hexadecimal 0s in the second row are replaced with hexadecimal A's.

14. A machine readable storage medium for storing data for access by an application program being executed on a computer system, the machine-readable storage medium comprising:
a data structure stored in the machine readable storage medium and being used by the application program, the data structure comprising:
an H-matrix in groups of four columns wherein;
a first column is a complement of a second column;
the value of the second column ranges from 1 to N in increments of two;
a third column is a complement of a fourth column;
the value of the fourth column is the same as the value of the second column less one; and
the H-matrix is shifted left by a number of columns to ensure every column in the matrix is unique.

15. The machine readable storage medium of claim 14 wherein the number of columns by which the matrix is shifted to the left is 16.

16. The machine readable storage medium of claim 15 further comprising replacing ones with zeroes in the second row of the matrix unless there would be column duplication.

17. The machine readable storage medium of claim 16 further comprising generating a bottom row of alternating zeroes and ones starting with a zero.

18. A memory, comprising:
a memory array;
an encode unit coupled to the memory array to receive a data word and operable to encode the data word using a matrix to generate corresponding check bits, the encode unit including components to implement a matrix having,
11 rows and 528 columns, the matrix having elements generated in groups of four columns for rows 1-10 wherein for each group of four columns,
a first column is a complement of a second column;
the value of the second column ranges from 9 to 271 in increments of two;
a third column is a complement of a fourth column; and
the value of the fourth column is the same as the value of the second column minus one;
row 11 is formed by alternating zeroes and ones starting with a zero in column 1;
an 11×11 identity matrix concatenated onto end of the 11×528 matrix to form an 11×539 matrix; and
a last 1×11 column matrix concatenated onto the end of the identity matrix to form an 11×540 matrix;
a compare unit coupled to the encode unit to receive the generated check bits and adapted to receive a second set of check bits, and operable to compare the check bits from the encode unit to the second set of check bits and to generate an error signal indicating the result of the comparison;
a buffer adapted to receive and store the data word and operable to provide the data word on an output responsive to an enable signal; and
a corrector unit coupled to the compare unit and to the buffer and operable to activate the enable signal responsive to the error signal indicating no errors have been detected and operable to correct single bit errors in the data word stored in the buffer responsive to the error signal indicating a single bit error and to thereafter activate the enable signal.

19. The memory of claim 18 wherein the memory array comprises an array of DRAM memory cells.

20. The memory of claim 18 wherein the binary values of the elements of the second column and in rows 1-10 of the matrix is any number greater than 6 and less than 1024.

21. The memory of claim 18 wherein the ones are replaced by zeroes in the second row of the 11×528 matrix unless there is a duplication of columns in the 11×540 matrix.

22. The memory of claim 18 wherein the corrector unit further comprises logic operable to correct the data word in the buffer based on a Hamming syndrome calculated by the compare unit.

23. An electronic system including a memory system, the memory system, comprising:
a memory array;
an encode unit coupled to the memory array to receive a data word and operable to encode the data word using a matrix to generate corresponding check bits, the encode unit including components to implement a matrix having, 11 rows and 528 columns, the matrix having elements generated in groups of four columns for rows 1-10 wherein for each group of four columns,
a first column is a complement of a second column;
the value of the second column ranges from 9 to 271 in increments of two;
a third column is a complement of a fourth column; and
the value of the fourth column is the same as the value of the second column minus one;
    row 1 is formed by alternating zeroes and ones starting with a zero in column 1;
    an 11×11 identity matrix concatenated onto end of the 11×528 matrix to form an 11×539 matrix; and
    a last 1×11 column matrix concatenated onto the end of the identity matrix to form an 11×540 matrix;
a compare unit coupled to the encode unit to receive the generated check bits and adapted to receive a second set of check bits, and operable to compare the check bits from the encode unit to the second set of check bits and to generate an error signal indicating the result of the comparison;

a buffer adapted to receive and store the data word and operable to provide the data word on an output responsive to an enable signal; and a corrector unit coupled to the compare unit and to the buffer and operable to activate the enable signal responsive to the error signal indicating no errors have been detected and operable to correct single bit errors in the data word stored in the buffer responsive to the error signal indicating a single bit error and to thereafter activate the enable signal.

24. The electronic system of claim 23 wherein the electronic system comprises a computer system.

25. The memory of claim 23 wherein the memory array comprises an array of DRAM memory cells.

\* \* \* \* \*